United States Patent
Sakai et al.

(10) Patent No.: US 6,477,438 B1
(45) Date of Patent: Nov. 5, 2002

(54) DESIGN SUPPORT APPARATUS, DEVICE ENVIRONMENTAL IMPACT ASSESSMENT APPARATUS AND COMPUTER-READABLE RECORDING MEDIUM RECORDED WITH A PROGRAM FOR CAUSING A COMPUTER TO SUPPORT CAD SYSTEM DESIGNING A DEVICE

(75) Inventors: Akira Sakai; Yuichi Arita; Tatsuro Shima; Tsukasa Tenma, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/549,168

(22) Filed: Apr. 13, 2000

(30) Foreign Application Priority Data

Jun. 2, 1999 (JP) .......................... 11-154669

(51) Int. Cl.[7] .............................. G06F 19/00
(52) U.S. Cl. .................. 700/97; 700/182; 264/401
(58) Field of Search .................. 700/98, 118, 174, 700/100, 169, 175, 182, 104, 215, 120, 119; 264/401; 345/496, 419; 101/423, 425

(56) References Cited

U.S. PATENT DOCUMENTS

| | | | | |
|---|---|---|---|---|
| 5,822,218 A | * | 10/1998 | Mossa et al. | 700/104 |
| 5,878,669 A | | 3/1999 | Becker et al. | 101/425 |
| 6,202,043 B1 | * | 3/2001 | Devion et al. | 700/104 |
| 6,223,092 B1 | * | 4/2001 | Miyakawa et al. | 700/100 |
| 6,230,066 B1 | * | 5/2001 | Sferro et al. | 345/419 |

FOREIGN PATENT DOCUMENTS

| | | |
|---|---|---|
| JP | 7-311792 | 11/1995 |
| JP | 9-282365 | 10/1997 |

* cited by examiner

Primary Examiner—Leo Picard
Assistant Examiner—Kidest Bahta
(74) Attorney, Agent, or Firm—Staas & Halsey LLP

(57) ABSTRACT

In a design support apparatus for supporting a CAD system designing a component, a material of the component indicated by a process request is specified based on a plurality of design information of the CAD system and an environmental impact of the component is calculated based on the environmental impact rate and weight of the component. Therefore, the environmental impact of the component indicated by the CAD system is assessed.

16 Claims, 32 Drawing Sheets

FIG.5

| MATERIAL NAME | SPECIFIC GRAVITY(kg/mm³) |
|---|---|
| ABS | 1.05E-06 |
| POM | 1.59E-06 |
| PC | 1.20E-06 |
| NI | 8.85E-06 |
| SUS301 | 7.90E-06 |
| ⋮ | ⋮ |

FIG.6

| MATERIAL NAME | $CO_2$(kg/kg) | $NO_X$(kg/kg) | $SO_X$(kg/kg) |
|---|---|---|---|
| ABS | 2.306 | 0.003547692 | 0.003074667 |
| POM | 3.978 | 0.00612 | 0.005304 |
| PC | 5.082 | 0.007818462 | 0.006776 |
| NI | 2.713 | 0.004173846 | 0.003617333 |
| SUS301 | 3.273 | 0.005035385 | 0.004364 |
| ⋮ | ⋮ | ⋮ | ⋮ |

FIG.7

| WORK ITEM | DECOMPOSITION TIME |
|---|---|
| SCREW (LENGTH≧5mm) | 15 SEC |
| SCREW (LENGTH<5mm) | 5 SEC |
| SNAP FIT CABLE CLAMP RIVET | 10 SEC |
| BOND/WELD | 60 SEC |
| SLIDE | 3 SEC |
| ⋮ | ⋮ |

FIG.15

| LCA INTERACTIVE CALCULATION RESULT | | | |

COMPONENT No. [            ]

EXPERIMENT No. [      ]

VOLUME [         ] mm³

WEIGHT [         ] kg $CO_2$ AMOUNT PRODUCED [         ] kg $NO_X$ AMOUNT PRODUCED [         ] kg $SO_X$ AMOUNT PRODUCED [         ] kg

[ CALCULATE ]   [ GRAPH ]

FIG.16

| LCA INTERACTIVE CALCULATION RESULT | | |
|---|---|---|

| COMPONENT No. | ca12345-y074 | |
|---|---|---|
| EXPERIMENT No. | 03 | |
| VOLUME | 26642.16 | mm³ |
| WEIGHT | 0.04235 | kg |
| $CO_2$ AMOUNT PRODUCED | 0.16847 | kg |
| $NO_x$ AMOUNT PRODUCED | 0.00130 | kg |
| $SO_x$ AMOUNT PRODUCED | 0.00022 | kg |

CALCULATE   GRAPH

DISPLAY SCREEN

DISPLAY SCREEN

FIG. 31

| EQUIPMENT | ABC-500 | DESIGN No. | CA12345-10 | | | |
|---|---|---|---|---|---|---|
| WEIGHT | 25.6kg | $CO_2$ AMOUNT PRODUCED | 11.218kg | $NO_X$ AMOUNT PRODUCED | 0.017kg | $SO_X$ AMOUNT PRODUCED | 0.015kg |

| COMPONENT | DESIGN No. | MATERIAL | WEIGHT | $CO_2$ AMOUNT PRODUCED | $NO_X$ AMOUNT PRODUCED | $SO_X$ AMOUNT PRODUCED |
|---|---|---|---|---|---|---|
| CO-ROM | CA12345-Y003 | ABS | 1.95E-01 | 3.70E-03 | 5.25E-05 | 7.85E-06 |
| CO-DSUB | CA12345-Y004 | PCM | 3.41E-02 | 1.53E-04 | 3.91E-06 | 6.94E-06 |
| CO-FDD | CA12345-Y005 | PC | 7.30E-01 | 4.63E-02 | 2.46E-04 | 2.58E-04 |
| . . . | . . . | . . . | . . . | . . . | . . . | . . . |
| MOLD-HOCK | CA12345-Y103 | ABS | 5.64E-03 | 5.49E-03 | 88.11E-06 | 2.51E-05 |

FIG.33

| MATERIAL | SPECIFIC GRAVITY(kg/mm³) | RECYCLE OR NOT |
|---|---|---|
| x x x | x x x x x x x | YES |
| x x x | x x x x x x x | NO |
| ⋮ | ⋮ | ⋮ |

FIG.34

RECYCLE OR NOT

EQUIPMENT  α β γ                                     CHANGE

|   | COMPONENT | MATERIAL | RECYCLE OR NOT | CHANGE OR NOT |
|---|---|---|---|---|
| 1 | aaaa | bbb | YES | |
| 2 | cccc | ddd | NO | CHANGE |
| 3 | eeee | f f f | YES | |
| 4 | gggg | hhh | NO | |
| 5 | i i i i | j j j | YES | |
| 6 | k k k k | l l l | YES | |
| 7 | mmmm | n n n | NO | CHANGE |

DESIGN SUPPORT APPARATUS, DEVICE ENVIRONMENTAL IMPACT ASSESSMENT APPARATUS AND COMPUTER-READABLE RECORDING MEDIUM RECORDED WITH A PROGRAM FOR CAUSING A COMPUTER TO SUPPORT CAD SYSTEM DESIGNING A DEVICE

BACKGROUND OF THE INVENTION

1. Field of the Invention

The present invention generally relates to a design support apparatus for a CAD system design in which an environmental impact caused by a designed component selected by a CAD system is assessed, a device environmental impact assessment apparatus in which an environmental impact caused by a device designed by the CAD system and a recycle potential are assessed and computer-readable recording media recorded with a program for causing a computer to realize the above apparatuses.

Since environmental problems have become a subject of attention, our society has been changing from a society of mass consumption and mass refuse forward a recycling society for environmental preservation. Recently, makers have been required to design then develop environmentally friendly products and to improve the recycling rate of the products.

2. Description of the Related Art

Conventionally, when the environmental impact of equipment design is assessed, it is conducted by designers based on their experiments and knowledge.

Since it is complicated and time consuming to assess the environmental impact based on designers' experiments and knowledge, a program for assessing the environmental impact has been developed.

In the program, information such as each component, its weight and materials of the equipment are input interactively by a designer. Based on the input information, the environmental impact of the equipment is computed. Thus, the program can be used to assess the environmental impact of the equipment, instead of the assessment being conducting by designers based on their experiments and knowledge.

As mentioned above, in the conventional program, the environmental impact of the equipment can be assessed approximately.

Generally, equipment is designed by using a CAD system. However, the conventional program is independently provided and does not interact with the CAD system.

Consequently, in the conventional program, it is impossible to automatically obtain information necessary to reduce the environmental impact of the equipment and it is required for a user to manually input weight, material name of each component of the equipment and so on.

Moreover, the conventional program does not provide functions to evaluate the equipment with a numerical grade for recycle potential, to show which components of the equipment can be recycled and to provide information to improve the recycling rate of the equipment.

SUMMARY OF THE INVENTION

It is a general object of the present invention to provide a design support apparatus and a device environmental impact assessment apparatus for supporting a CAD system designing an environmentally friendly component or device and a computer-readable recording medium recorded with a program for enabling a computer to realize the above apparatuses in which the above-mentioned problems are eliminated.

A more specific object of the present invention is to provide a design support apparatus for a CAD system design in which an environmental impact caused by a designed component selected by a CAD system is assessed, a device environmental impact assessment apparatus in which an environmental impact caused by a device designed by the CAD system and a device recycle potential are assessed, and a computer-readable recording medium recorded with a program for causing a computer to realize the above apparatuses.

The above objects of the present invention are achieved by a computer-readable recording medium recorded with program code for causing a computer to support a CAD system in designing a device made of at least one component, the program including the code for: (a) specifying a material of the component indicated by a process request of the CAD system based on a plurality of design information in the CAD system; (b) retrieving an environmental impact rate of the material specified by the code (a) by accessing a database managing the environmental impact rate per unit weight of the each material; (c) calculating an environmental impact of the component based on the environmental impact rate retrieved by the code (b) and weight of the component indicated by the process request; (d) calculating the environmental impact of the device based on each component calculated by the code (c); and (e) selectively outputting the environmental impact of at least one component, which impact is calculated by the code (c), or the environmental impact the device, which impact is calculated by the code (d), so that the environmental impact of the component or the device indicated by the CAD system is assessed.

According to the present invention, it is possible for a user to know how much environmental impact the designed component or device will have. Therefore, the user can design an environmentally friendly component or device that will have less environmental impact.

The above objects of the present invention are achieved by a computer-readable recording medium recorded with program code for causing a computer to support a CAD system in designing a device made of at least one component, said program including the codefor: (a) obtaining a plurality of CAD design information of a device indicated by a process request of the CAD system; (b) specifying a material of the component indicated by the process request based on the CAD design information obtained by the code (a); (c) obtaining the recycle information of the material specified by the code (b) by accessing a database managing recycle information that indicates whether or not each material is recyclable and updating the recycle information when the recycle information is changed from recyclable to not recyclable; (d) calculating a recycle potential of the device indicated by the process request based on the recycle information provided by the code (c) and an amount of each component used for the device; and (e) outputting the recycle potential calculated by the code (d), so that the recycle potential of the device designed by the CAD system is assessed.

According to the present invention, it is possible for a user to know whether or not the designed device is recyclable. Therefore, the user can design an environmentally friendly device that is recyclable.

The above objects of the present invention are achieved by a design support apparatus for supporting a CAD system in designing a component, including: a specifying part specifying a material of the component indicated by a process request of the CAD system based on a plurality of design information of the CAD system; a retrieving part retrieving an environmental impact rate of the material specified by the specifying part by accessing a database managing the environmental impact rate per unit weight of the each material; a calculating part calculating an environmental impact of the component based on the environmental impact rate retrieved by the retrieving part and weight of the component indicated by the process request; and an outputting part outputting the environmental impact of the component, which impact is calculated by the calculating part, so that the environmental impact of the component indicated by the CAD system is assessed.

According to the present invention, it is possible to provide the design support apparatus in which a user can know how much environmental impact the designed component will have. Therefore, the design support apparatus can support the user using the CAD system to design an environmentally friendly component that will have less environmental impact.

The above objects of the present invention are achieved by a device assessment apparatus for supporting a CAD system in designing a device made of at least one component, including: an obtaining part obtaining a plurality of CAD design information of the device indicated by a process request of the CAD system; a specifying part specifying a material of the component indicated by a process request of the CAD system based on the design information of the CAD system; a retrieving part retrieving an environmental impact rate of the material specified by the specifying part by accessing a database managing the environmental impact rate per unit weight of the each material; a first calculating part calculating an environmental impact of the component based on the environmental impact rate retrieved by the retrieving part and weight of the component indicated by the process request; a second calculating part calculating the environmental impact of the device based on each component calculated by the first calculating part; and an outputting part outputting at least one of the environmental impact of the component, which impact is calculated by the first calculating part, and the environmental impact of the device, which impact is calculated by the second calculating part; so that the environmental impacts of the component and the device that are designed by the CAD system are assessed.

According to the present invention, it is possible to provide the device assessment apparatus which can assess the environmental impact of the designed component or device so that a user or a designer can know how much environmental impact the designed component or device will have. Therefore, the device assessment apparatus can support the user using the CAD system to design an environmentally friendly component that will have less environmental impact.

The above objects of the present invention are achieved by a device assessment apparatus for supporting a CAD system designing a device made of at least one component, including: an obtaining part obtaining a plurality of CAD design information of a device indicated by a process request of the CAD system; a specifying part specifying a material of the component indicated by a process request of the CAD system based on the design information of the CAD system; an obtaining part obtaining the recycle information of the material specified by the specifying part by accessing a database managing recycle information that indicates whether or not each material is recyclable and updating the recycle information when the recycle information is changed from recyclable to not recyclable; a calculating part calculating a recycle potential of the device indicated by the process request based on the recycle information provided by the obtaining part and an amount of each component used for the device; and an outputting part outputting the recycle potential calculated by the calculating part, so that the recycle potential of the device designed by the CAD system is assessed.

According to the present invention, it is possible to provide the device assessment apparatus which can assess the recycle impact of the designed component or device so that a user can know whether or not the designed device is recyclable. Therefore, the user can design an environmentally friendly device that is recyclable.

BRIEF DESCRIPTION OF THE DRAWINGS

Other objects, features and advantages of the present invention will become more apparent from the following detailed description when read in conjunction with the accompanying drawings, in which:

FIG. 5 is a diagram showing a material database according to the embodiment of the present invention;

FIG. 6 is a diagram showing an environmental impact database according to the embodiment of the present invention;

FIG. 7 is a diagram showing a decomposition time database according to the embodiment of the present invention;

FIG. 15 is a diagram showing an LCA interactive calculation result window according to the embodiment of the present invention;

FIG. 16 is a diagram showing the LCA interactive calculation result window according to the embodiment of the present invention;

FIG. 31 is a diagram showing an environmental impact information table according to the embodiment of the present invention;

FIG. 33 is a diagram showing a material database according to the present invention; and FIG. 34 is a diagram showing a recyclable component setting window according to the present invention;

DESCRIPTION OF THE PREFERRED EMBODIMENTS

Figure 1:
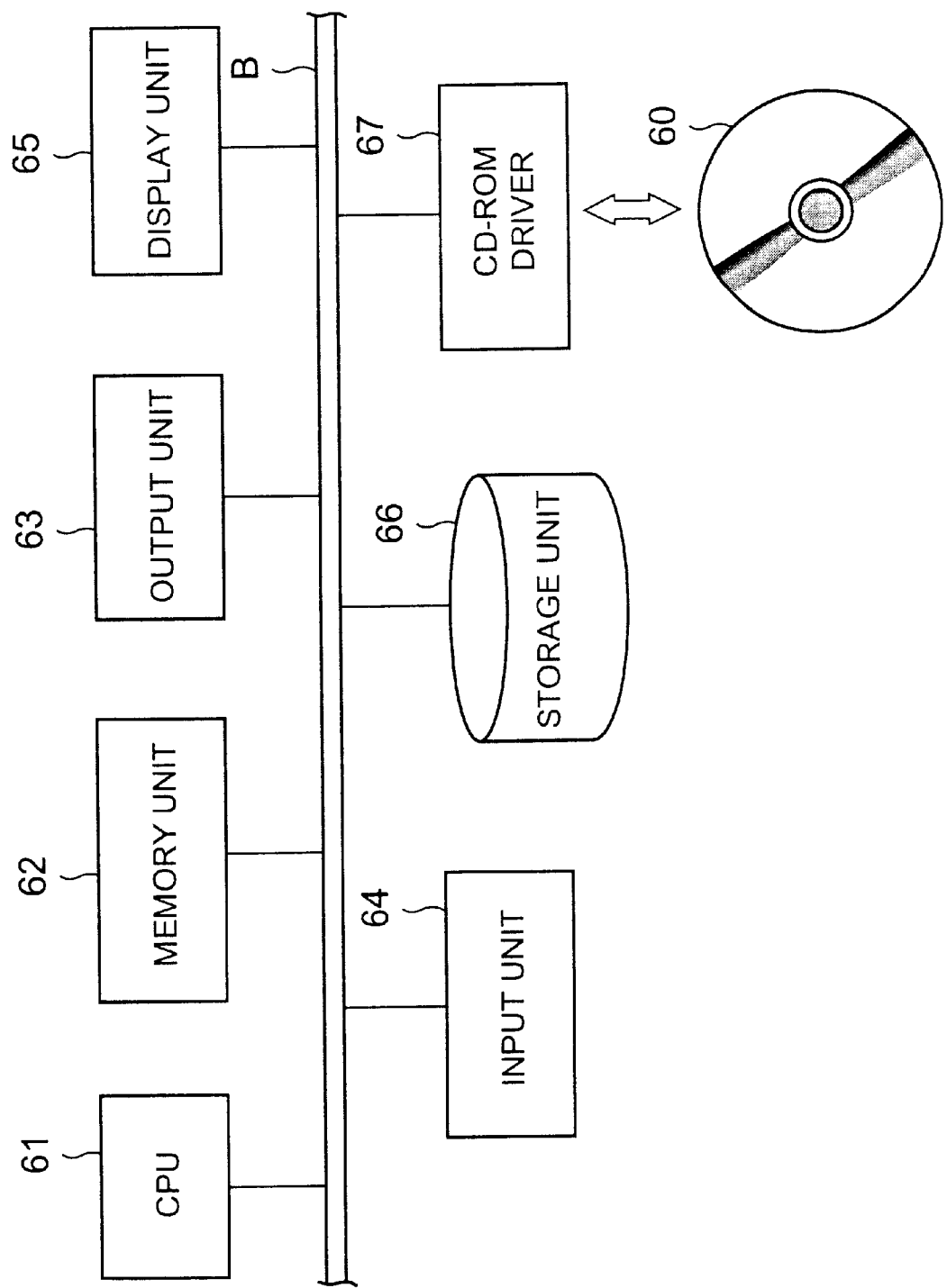
FIG. 1 is a diagram showing a hardware configuration according to an embodiment of the present invention.

An information processing apparatus, which includes a design support apparatus and a device environmental impact assessment apparatus according to the present invention, has a hardware configuration such as shown in FIG. 1.

In FIG. 1, the information processing apparatus includes a CPU 61, a memory unit 62, an output unit 63, an input unit 64, a display unit 65, a storage unit 66 and a CD-ROM driver 67 which are mutually connected by a bus. The CPU 61 controls the entire system in accordance with a program stored in the memory unit 62. In addition, the CPU 61 executes processes concerning the design support apparatus and the device environmental impact assessment apparatus that will be described later. The memory unit 62 includes ROM and RAM. Also, the memory unit 62 temporarily stores programs, tables, various data and the like during the execution of the processes. The input unit 64 includes a keyboard and a mouse for a user to input information into the system, but is not limited to only these input devices.

The display unit 65 displays menus of various processes, results of processes, or the like. The output unit 63 outputs data from the memory unit 62 as directed by an output instruction of the CPU 61 based on a user operation from the input unit 64.

The storage unit 66 includes a hard disk unit and stores various files and programs. Also, the storage unit 66 stores various databases provided from recording media. In accordance with instructions from the CPU 61, the CD-ROM driver 67 reads information from the CD-ROM 60 set in the CD-ROM driver 67 and then provides the information to the storage unit 66. For example, a program according to the above-mentioned design support apparatus and a program according to the above-mentioned device environmental impact assessment apparatus are provided by the CD-ROM 60. That is, programs read from the CD-ROM 60 are installed into the storage unit 66 through the CD-ROM driver 67. Also, various databases may be provided to the information processing apparatus by the CD-ROM 60. It should be noted that a recording medium is not limited to a CD-ROM, but other computer-readable recording media such as a magnetic disk, a magnetic tape, an optical disk, a magneto optical disk, a semiconductor memory or the like may be used.

Figure 2:
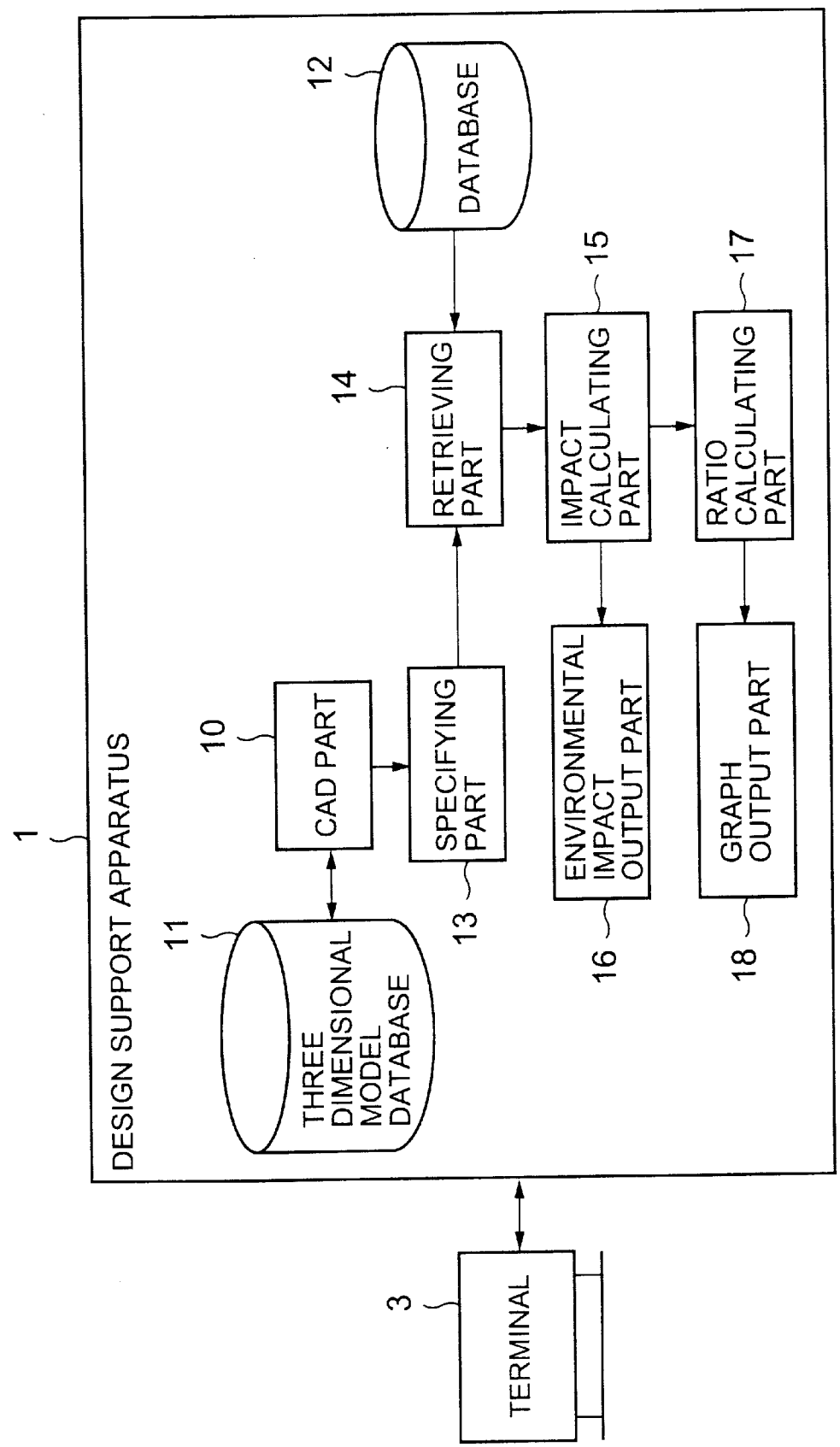
FIG. 2 is a block diagram showing a principal configuration of a design support apparatus according to a first embodiment of the present invention.

FIG. 2 is a block diagram showing a principal configuration of the design support apparatus according to an embodiment of the present invention.

The design support apparatus 1 according to the present invention conducts a process for supporting a CAD system design by assessing the environmental impact of design components indicated by the CAD system. As shown in FIG. 2, the design support apparatus includes a CAD part 10, a three-dimensional model database 11, a database 12, a specifying part 13, a retrieving part 14, a impact calculating part 15, an environmental impact output part 16, a ratio calculating part 17 and a graph output part 18. In addition, the design support apparatus is connected to a terminal 3.

The CAD part 10 includes the CAD system by which a designer designs a device interactively. The three-dimensional model database 11 stores three-dimensional models designed using the CAD part 10.

The database 12 manages an environmental impact rate for a unit amount of each material. The specifying part 13 specifies a material of the design component based on a plurality of design information created by the CAD part 10 in response to a process request. The retrieving part 14 retrieves the environmental impact rate of the material specified by the specifying part 13 by accessing the database 12.

The impact calculating part 15 calculates the environmental impact of the design component indicated by the process request based on the environmental impact rate retrieved by the retrieving part 14 and a weight of the design component. The environmental impact output part 16 outputs the environmental impact calculated by the impact calculating part 15.

When an assessment request is made for the same previously assessed design component, the ratio calculating part 17 calculates ratios of an impact value based on previous impact values calculated by the impact calculating part 15. The graph output part 18 outputs a graph diagram showing the ratios calculated by the ratio calculating part 17.

In the design support apparatus according to the present invention, the CAD part 10 indicates the design component for the process request and initiates the assessment request for the environmental impact to the specifying part 13. The specifying part 13 specifies the material of the design component for the process request based on CAD design information of the design component and then the retrieving part 14 retrieves the environmental impact rate of the material specified by the specifying part 13.

In response to the process of the retrieving part 14, the impact calculating part 15 calculates the environmental impact of the design component for the process request based on the environmental impact rate retrieved by the retrieving part 14 and the weight of the design component for the process request. Subsequently, the environmental impact output part 16 displays the environmental impact calculated by the impact calculating part 15, for example, in a window such as a CAD edit window displayed by the CAD part 10.

When the assessment request is made for the same previously assessed design component, the ratio calculating part 17 calculates ratios of the impact value calculated by the impact calculating part 15 to previous impact values calculated by the impact calculating part 15 beforehand. After that, the graph output part 18 outputs the graph diagram showing the ratios calculated by the ratio calculating part 17, for example, in the CAD edit window displayed by the CAD part 10.

As mentioned above, in the design support apparatus 1, when the CAD system indicates a design component and initiates an assessment request for the environmental impact, the environmental impact of the design component for the assessment request is calculated and displayed in the CAD edit window. Therefore, it is possible for a designer to know the environmental impact while the designer designs components by using the CAD system. Accordingly, it is possible for the designer to design devices or equipment in which the environmental impact is reduced to a minimum.

In addition, when the designer changes the shape or material of the same design component, the ratio of the environmental impact is re-calculated in response to the design change. The graph diagram is updated based on the re-calculated ratio and displayed in the CAD edit window. Thus, when the designer designs components by using the CAD system, it is possible for the designer to know how to reduce the environmental impact and how much the environmental impact can be reduced. Accordingly, it is possible for the designer to design devices or equipment in which the environmental impact is reduced to the minimum.

Figure 3:
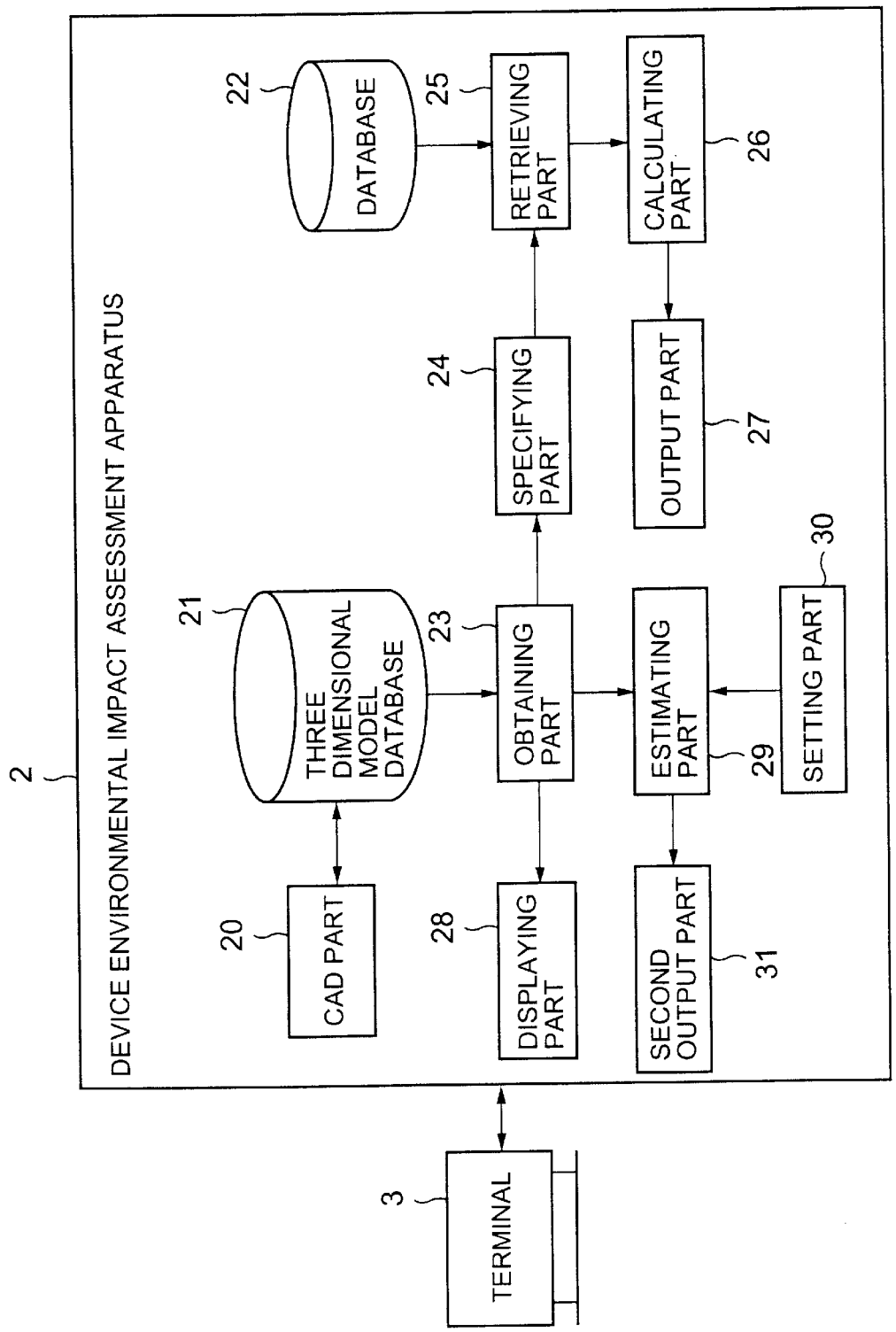
FIG. 3 is a block diagram showing a principal configuration of a device environmental impact assessment apparatus according to the embodiment of the present invention.

FIG. 3 is a block diagram showing a principal configuration of the device environmental impact assessment apparatus according to the embodiment of the present invention.

The device environmental impact assessment apparatus 2 according to the present invention conducts processes for assessing the environmental impact of the whole device or equipment and evaluating the recycle potential. As shown in FIG. 3, the device environmental impact assessment apparatus 2 includes a CAD part 20, a three-dimensional model database 21, a database 22, an obtaining part 23, a specifying part 24, a retrieving part 25, a calculating part 26, an output part 27, a displaying part 28, an estimating part 29, a setting part 30 and a second output part 31. In addition, the device environmental impact assessment apparatus 2 is connected to the terminal 3 in FIG. 3.

The CAD part 20 includes the CAD system by which the designer designs the device or equipment interactively. The three-dimensional model database 21 stores three-dimensional models designed using the CAD part 20.

The database 22 manages the environmental impact rate for a unit amount of each material to assess the environmental impact and manages recycle information showing whether or not each material is recyclable in order to evaluate the recycle potential.

The obtaining part 23 obtains CAD design information based on the device for a process request. The specifying part 24 specifies the material of each component used for the device indicated by the process request from the CAD design information obtained by the obtaining part 23.

The retrieving part 25 retrieves the environmental impact rate of the material specified by the specifying part 24 by accessing the database 22 in order to assess the environmental impact. In addition, the retrieving part 25, in order to evaluate the recycle potential, retrieves the recycle information of the material specified by the specifying part 24 by accessing the database 22 and allows the designer to change 'recyclable' indicated by the recycle information to 'not recyclable' if necessary.

The calculating part 26 calculates the environmental impact of the device indicated by the process request based on the environmental impact rate retrieved by the retrieving part 25 and the amount of each component used for the device in order to assess the environmental impact. In addition, the calculating part 26 calculates the recycle potential of the device indicated by the process request based on the recycle information retrieved by the retrieving part 25 and the amount of each component used for the device indicated by the process request in order to evaluate the recycle potential.

The output part 27 outputs the environmental impact of the device indicated by the process request calculated by the calculating part 26 in order to assess the environmental impact. Also, the output part 27 outputs the recycle potential of the device indicated by the process request calculated by the calculating part 26 in order to evaluate the recycle potential.

The displaying part 28 displays the three-dimensional model of the device indicated by the process request on the display unit 65 in FIG. 1 while using an identical display color for the same material. Or the displaying part 28 shows components, which have the same material of the indicated component, by the same color of the material of the indicated component and shows other components with different colors. When the indicated component is behind another component, the display color of the component hiding the indicated component may be translucent. Accordingly, the three-dimensional model of the device indicated by the process request is displayed using colors on the display unit 65.

The estimating part 29 specifies a decomposition process and the number of decomposition steps and obtains a decomposition time per unit time required for the decomposition process. And, the estimating part 29 estimates the decomposition time of the device based on this information. The setting part 30 sets another device that is to be compared to the device indicated by the process request.

The second output part 31 outputs a comparison result of the decomposition time, of the device indicated by the process request, estimated by the estimating part 29 and another decomposition time, of another device set by the setting part 30, estimated by the estimating part 29. In addition, the second output part 31 may output comparison results about the weight or volume of a part of or the entire components of the device indicated by the process request and those of another device set by the setting part 30.

As described above, in the device environmental impact assessment apparatus 2, when the user such as a designer initiates the assessment request by indicating the device for the process request, the obtaining part 23 obtains the CAD design information of the device of the process request from the three-dimensional model database 21. Subsequently, the specifying part 24 specifies the material of each component used for the device of the process request based on the CAD design information obtained by the obtaining part 23. Then, the retrieving part 25 retrieves the environmental impact rate of the material specified by the specifying part 24 by accessing the database 22.

In response to the process of the retrieving part 25, the calculating part 26 calculates the environmental impact of the device indicated by the process request based on the environmental impact rate retrieved by the retrieving part 25 and the amount of each component used for the device. The output part 27 outputs the environmental impact of the device indicated by the process request calculated by the calculating part 26.

Also, in the device environmental impact assessment apparatus 2 according to the present invention, when the user or the designer initiates the assessment request for the recycle potential by indicating the device for the process request, the obtaining part 23 obtains the CAD design information of the device of the process request from the three-dimensional model database 21. Subsequently, the specifying part 24 specifies the material of each component used for the device of the process request based on the CAD design information obtained by the obtaining part 23. Then, the retrieving part 25 retrieves the environmental impact rate of the material specified by the specifying part 24 by accessing the database 22.

In response to the process of the retrieving part 25, the calculating part 26 calculates the environmental impact rate of the device indicated by the process request based on the recycle information of each component used for the device indicated by the process request retrieved by the retrieving part 25 and the amount of each component used for the device. After that, the output part 27 outputs the recycle potential calculated by the calculating part 26.

In the above processes, the displaying part 28 displays the three-dimensional model of the device indicated by the process request on the display unit 65 in FIG. 1 while using an identical display color for the same material. Or the displaying part 28 shows components, which have the same material of the indicated component, by the same color of the material of the indicated component and shows other components using different colors. When the indicated component is behind another component, the material color of the indicated component may be translucent. Accordingly, the three-dimensional model of the device indicated by the process request is displayed using colors on the display unit 65.

The estimating part 29 specifies the decomposition process and the number of decomposition steps and obtains the decomposition time per unit time required for the decomposition process. And, the estimating part 29 estimates the decomposition time of the device based on this information.

The setting part 30 sets another device that is to be compared to the device indicated by the process request.

As described above, in the device environmental impact assessment apparatus 2 according to the present invention, when the user initiates the assessment request for the environmental impact by indicating a device designed by the CAD system, the CAD design information of the device, which is designed by the CAD system, indicated by the process request is obtained. Based on the CAD design information, the environmental impact of the device indicated by the process request is computed and output. Accordingly, by simply making the assessment request, it is possible for the user to know the environmental impact of the device designed using the CAD system.

The three-dimensional model of the device indicated by the process request is displayed on the display unit 65 in FIG. 1 while using an identical display color for the same material. Or the displaying part 28 shows components, which have the same material of the indicated component, by the same color of the material of the indicated component and shows other components with different colors. Accordingly, the three-dimensional model of the device indicated by the process request is displayed by colors on the display unit 65. Thus, the user can recognize where the component is located in the device and which material used in the device has a large environmental impact. Consequently, it is possible for the user to effectively consider how to change the material and how much the environmental impact can be reduced. Therefore, the device that has the minimum environmental impact can be realized.

Furthermore, within the design each time the material is changed, an engagement method is changed or a sub-unit of the device is changed, the new decomposition time is estimated and a comparison with the previous composition form of the device is also output. It is possible for the user to consider the decomposition time while the user changes the material of the device.

In addition, in the device environmental impact assessment apparatus 2 according to the present invention, when the user initiates the assessment request for the recycle potential by indicating the device designed by using the CAD system, the CAD design information of the device, which is designed by the CAD system, of the process request is obtained. Based on the CAD design information, the recycle potential of the device indicated by the process request is computed and output. Therefore, the user simply initiates the assessment request. Then, it is possible for the user to recognize the recycle potential of the device designed using the CAD system.

The three-dimensional model of the device indicated by the process request is displayed on the display unit 65 in FIG. 1 while using an identical display color for the same material. Or the displaying part 28 shows components, which have the same material of the indicated component, by the same color of the material of the indicated component and shows other components with different colors. Accordingly, the three-dimensional model of the device indicated by the process request is displayed using colors on the display unit 65. Thus, the user can recognize where the component is located in the device and which material used in the device has the large environmental impact. Consequently, it is possible for the user to effectively consider how to change the material and how much the environmental impact can be reduced. Therefore, the device that has the minimum environmental impact can be realized.

Furthermore, within the design each time the material is changed, the engagement method is changed or the sub-unit of the device is changed, the new decomposition time is estimated and the comparison with the previous composition form of the device is also output. It is possible for the user to consider the decomposition time while the user changes the material of the device.

Figure 4:
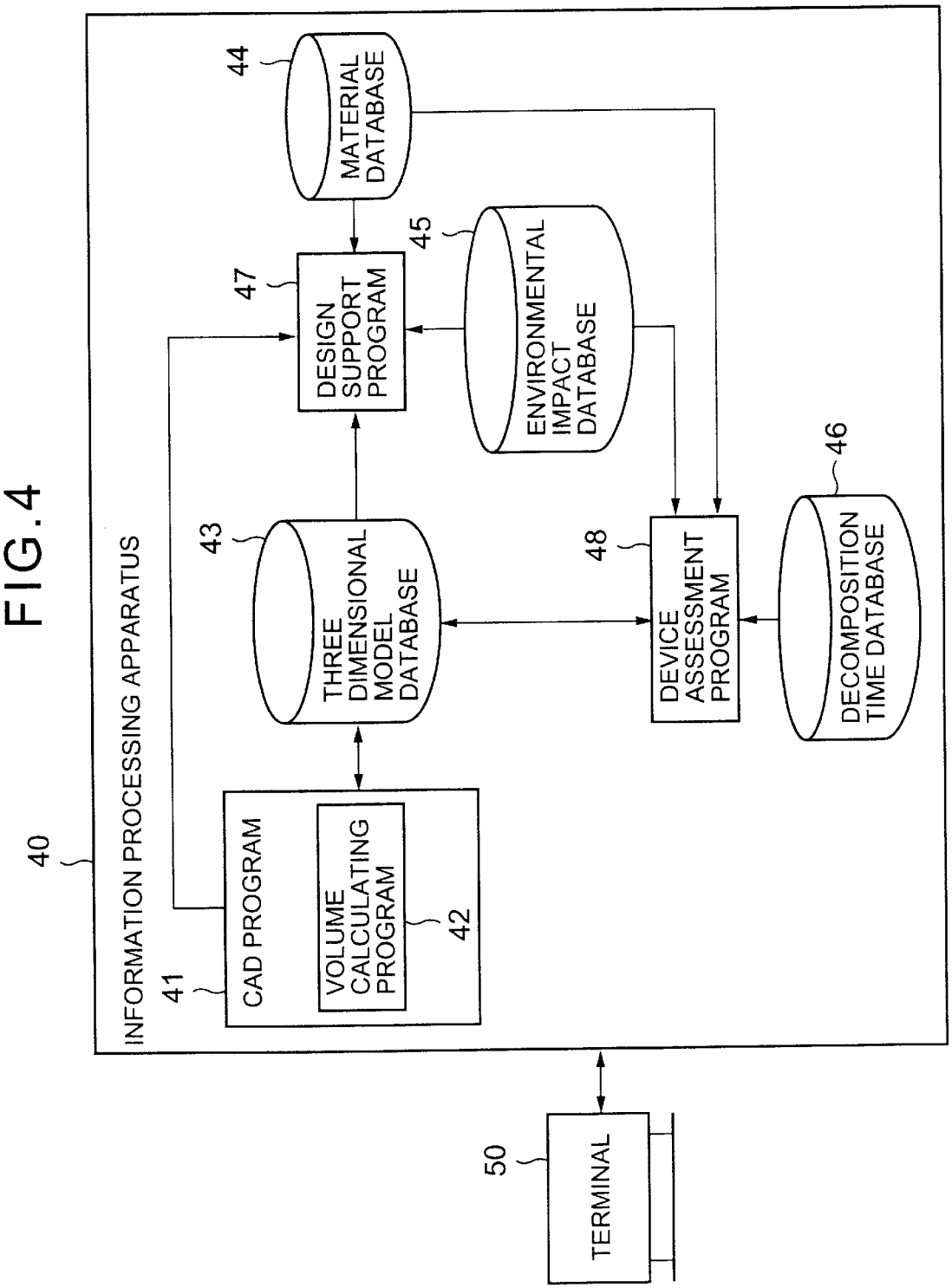
FIG. 4 is a diagram showing an information processing apparatus according to the embodiment of the present invention.

FIG. 4 is a diagram showing the information processing apparatus according to the present invention.

In FIG. 4, the information processing apparatus 40 according to the present invention supports the design of components by executing CAD programs while assessing the environmental impact of the designed component indicated by the CAD programs and evaluating the recycle potential of the device. The information processing apparatus 40 includes a terminal 50 to communicate with the user.

The information processing apparatus 40 includes a CAD program 41, a volume calculating program 42, a three-dimensional model database 43, a material database 44, an environmental impact database 45, a decomposition time database 46, a design support program 47 corresponding to the design support apparatus 1 in FIG. 2 and a device assessment program 48 corresponding to the device assessment apparatus 2 in FIG. 3.

The CAD program 41 is used to design the shape of the device interactively with the user, design components used for making the device by allocating materials to the designed components and design engagements among the designed components.

The volume calculating program 42 is a part of in the CAD program 41 and calculates the volume of the designed component.

The three-dimensional model database 43 stores three-dimensional models designed by the CAD program 41.

The material database 44 as shown in FIG. 5 manages the materials allocated by the CAD program 41 and the specific gravity each material.

The environmental impact database 45 as shown in FIG. 6 manages the materials allocated by the CAD program 41 and $CO_2$, $NO_x$ and $SO_x$ amounts produced per unit of each material. The amount produced per unit indicates an amount produced when 1 Kg of a material is produced.

The decomposition time database 46 as shown in FIG. 7 manages work items and a decomposition time required for each work item.

The design support program 47 is installed by the CD-ROM in FIG. 1, a floppy disk or via a telephone line or a network and executes processes for supporting the CAD program 41 to design components by assessing the environmental impact of the designed components indicated by the CAD program 41.

The device environmental impact assessment program 48 is installed by the CD-ROM in FIG. 1 or a floppy disk or via a telephone line or a network and executes process for supporting the CAD program 41 in designing by assessing the environmental impact and evaluating the recycle potential of the device designed.

Figure 8:
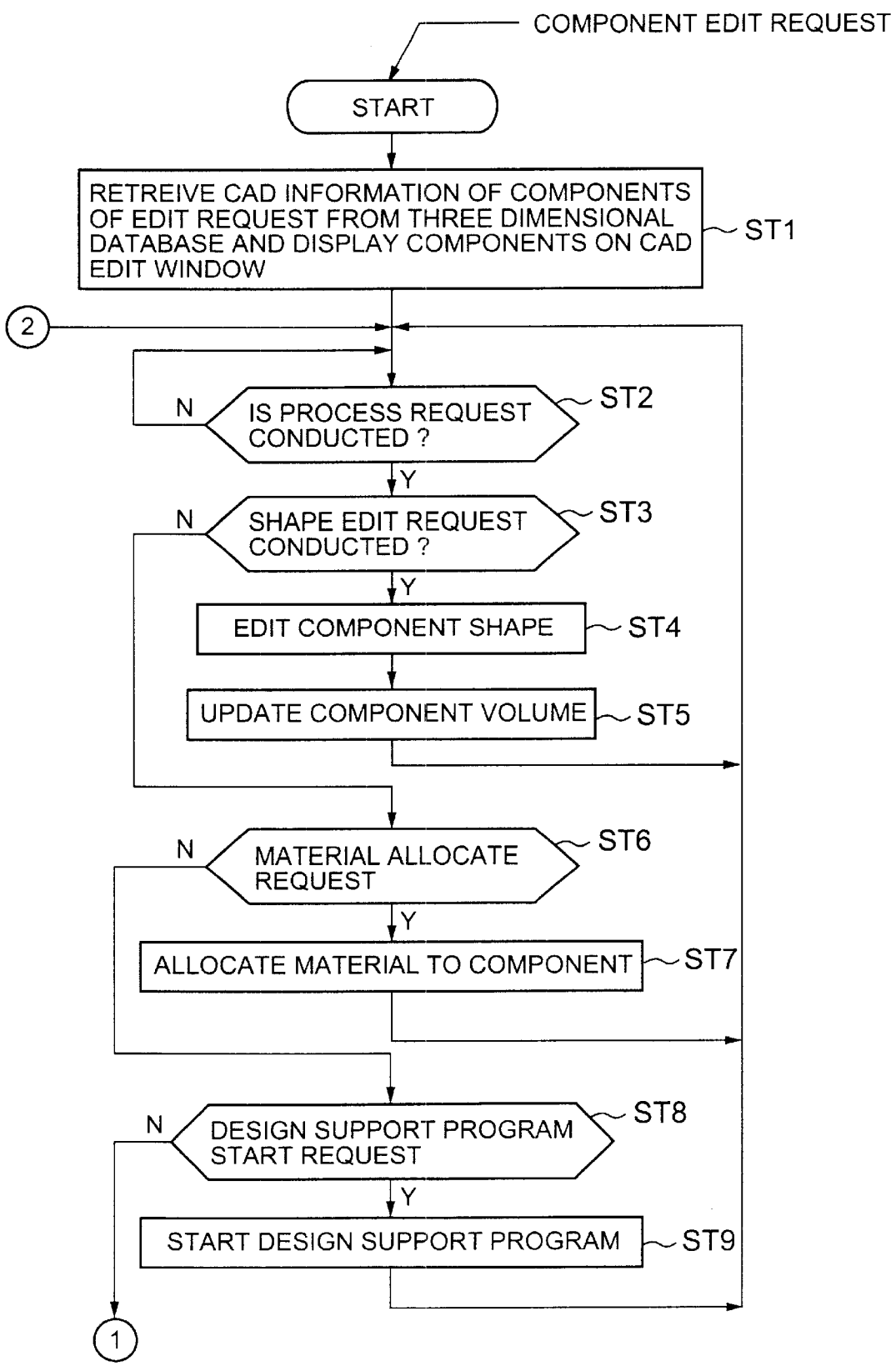
FIG. 8 is a flowchart for explaining a process executed by a CAD program according to the embodiment of the present invention.
Figure 9:
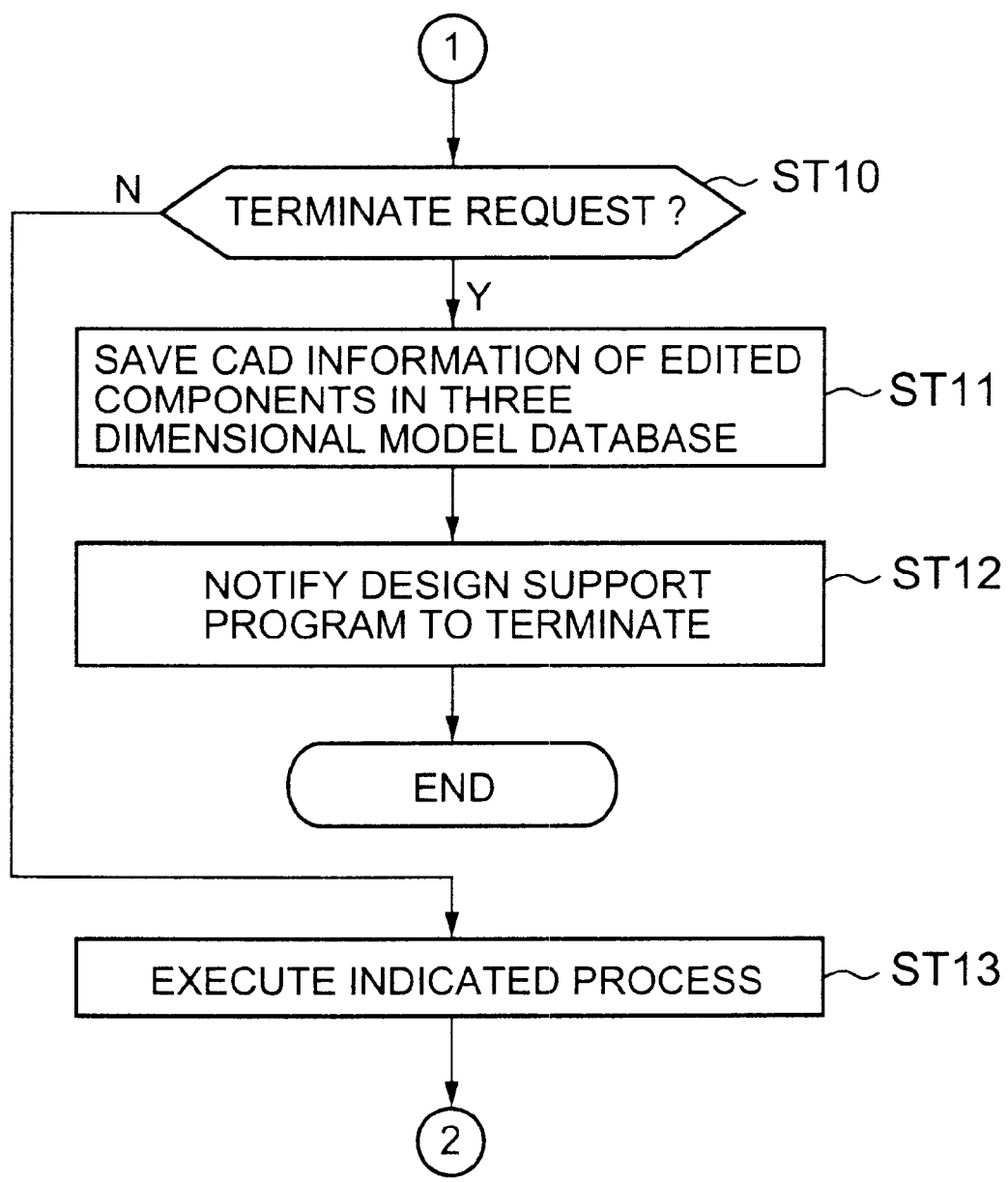
FIG. 9 is a flowchart for explaining the process executed by the CAD program according to the embodiment of the present invention.
Figure 10:
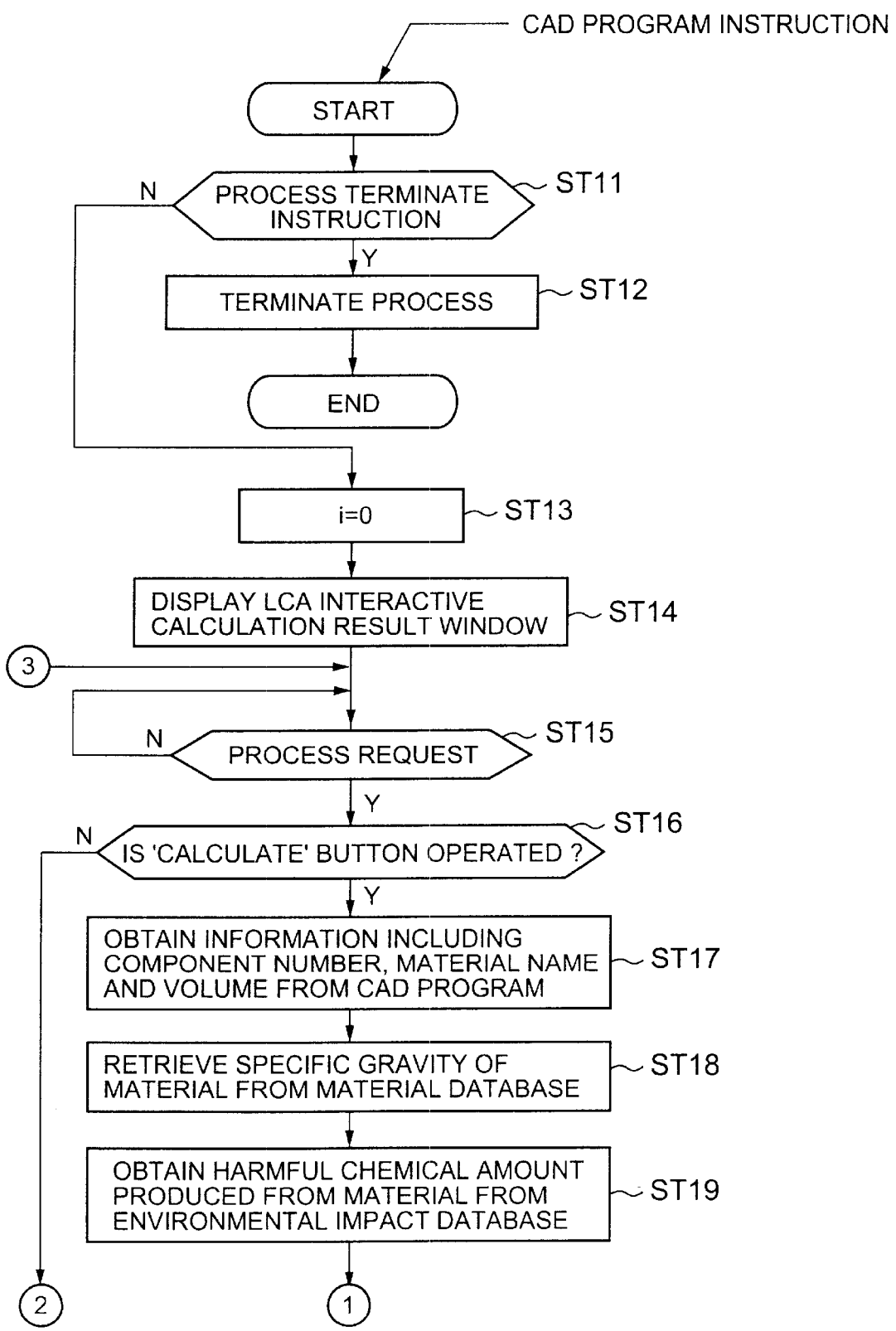
FIG. 10 is a flowchart for explaining a process executed by a design support program according to the embodiment of the present invention.
Figure 11:
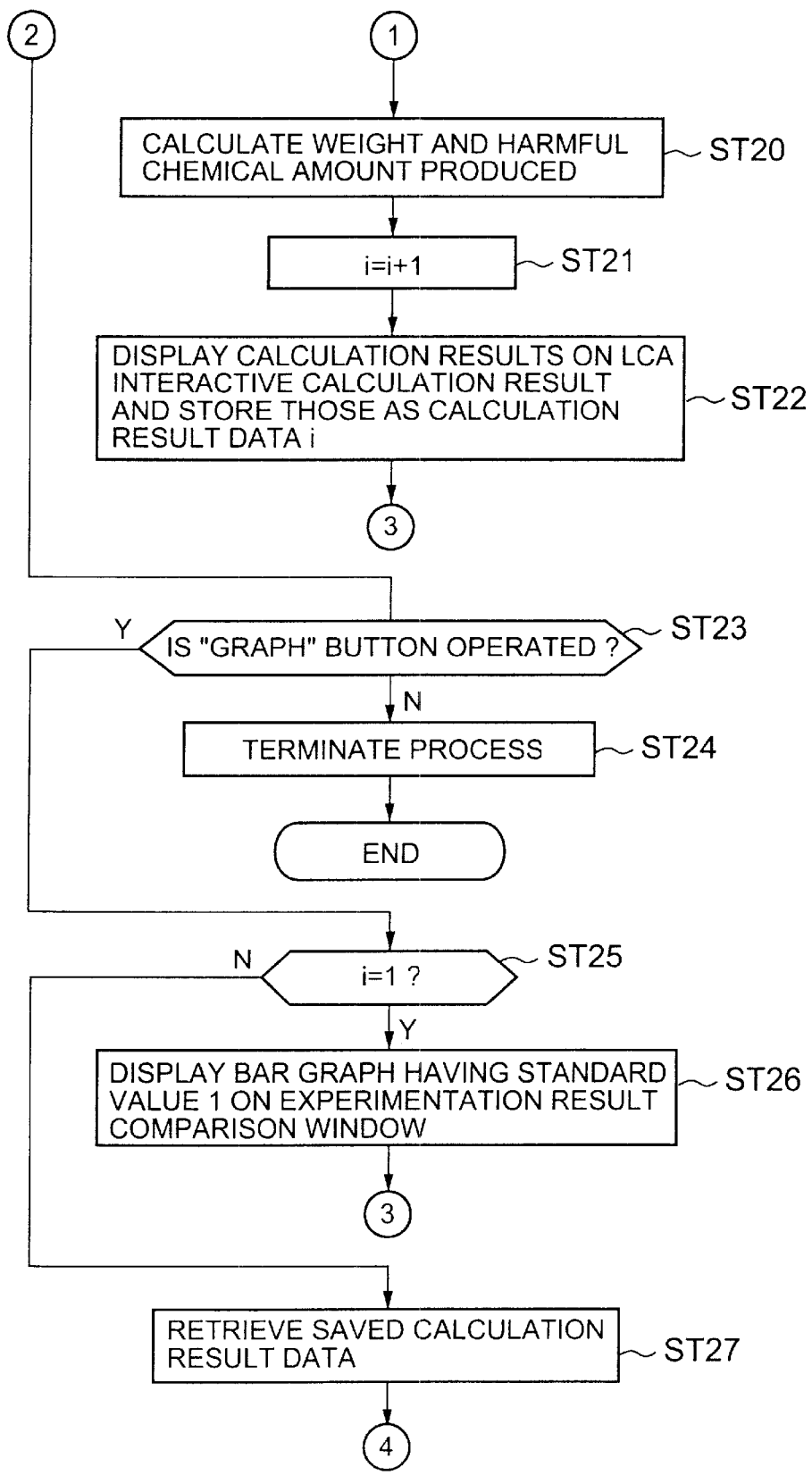
FIG. 11 is a flowchart for explaining the process executed by the design support program according to the embodiment of the present invention.
Figure 12:
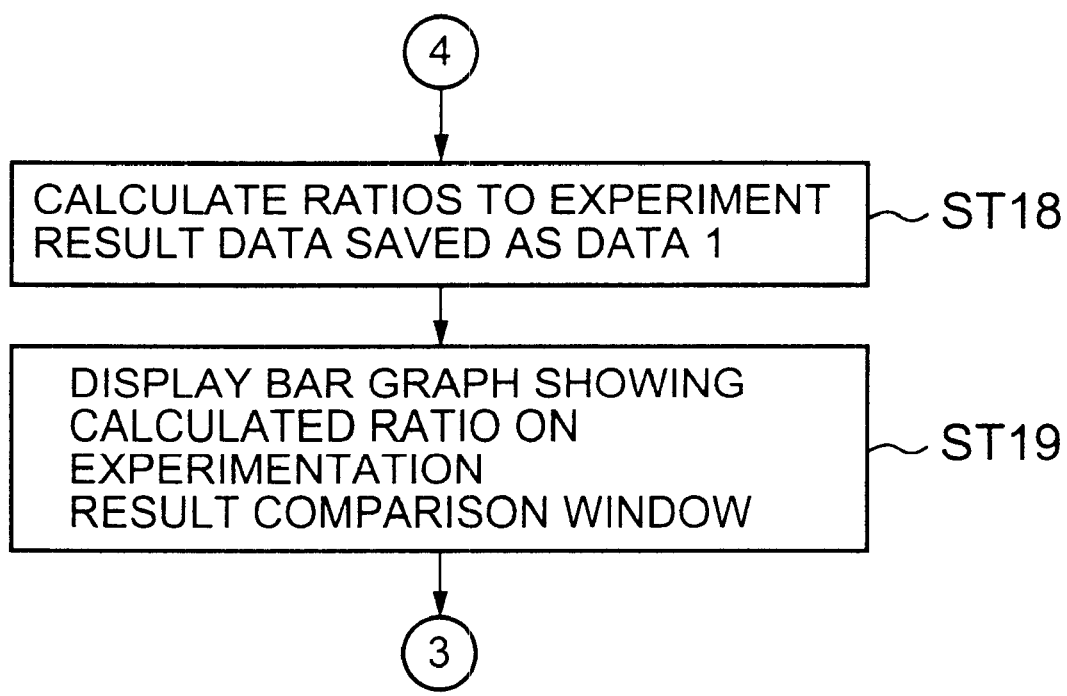
FIG. 12 is a flowchart for explaining the process executed by the design support program according to the embodiment of the present invention.

FIG. 8 and FIG. 9 are flowcharts for explaining processes executed by the CAD program 41 according to the present invention. FIGS.10, 11 and 12 are flowcharts for explaining processes executed by the design support program 47.

Referring to these figures, the CAD program 41 executed by the information processing apparatus 40 according to the present invention while associating with the design support process will now be described.

Figure 13:
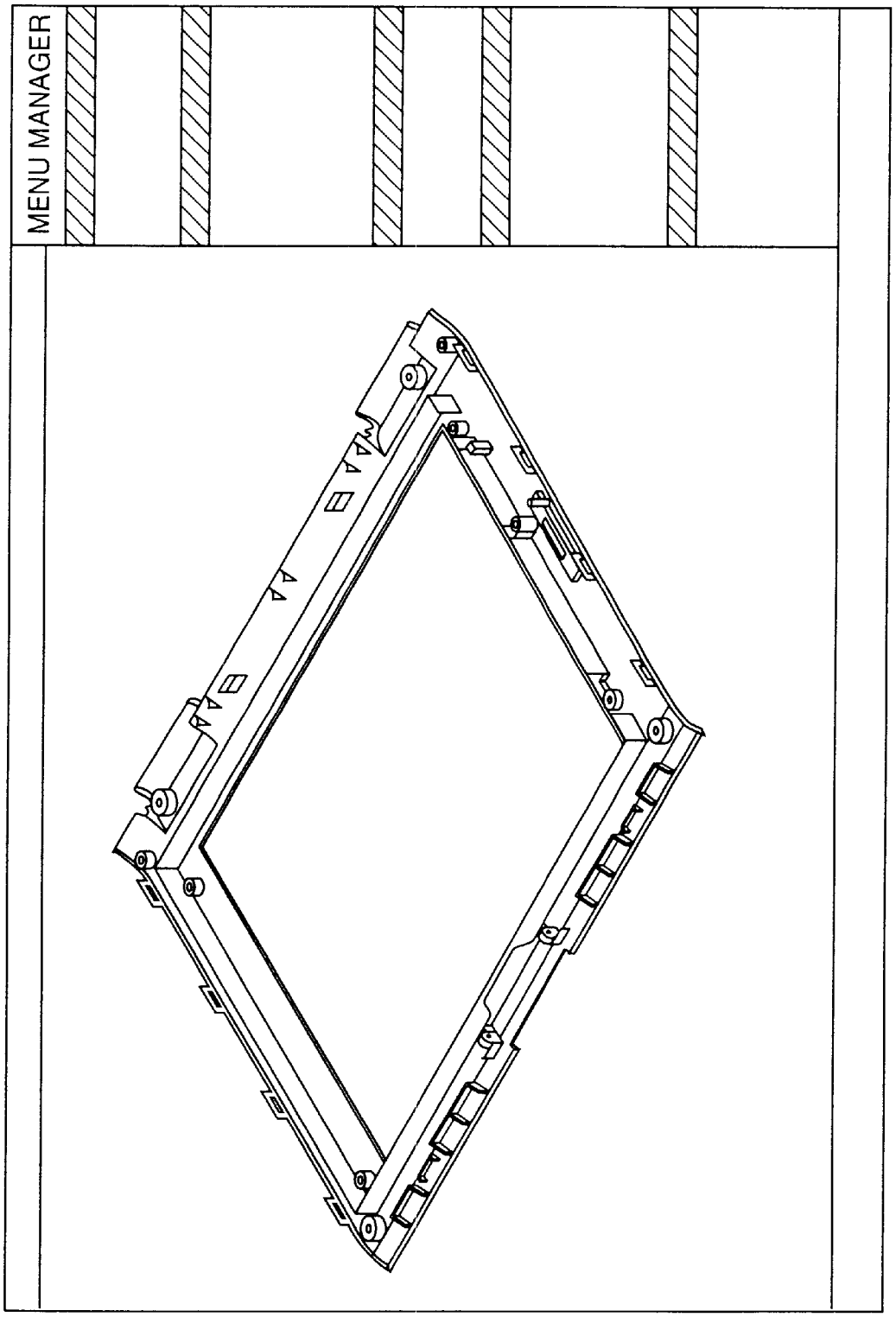
FIG. 13 is a diagram showing a CAD edit window according to the embodiment of the present invention.

When a designer as a user initiates an edit request for components used for a device, the CAD program 41, as shown in the flowcharts in FIG. 8 and FIG. 9, retrieves CAD information of components for the edit request and displays a three-dimensional model of the components on a CAD edit window based on the CAD information retrieved in step ST1. For example, as shown in FIG. 13, the three-dimensional model of a component of the edit request is displayed on the CAD edit window.

When the edit request made by the designer is a new edit request for editing a new component, the CAD program 41 does not retrieve any CAD information from the three-dimensional database 43.

In step ST2, the CAD program 41 waits until the designer operates a menu displayed on the CAD edit window and then a process request is made by the designer. When the CAD program 41 determines that the process request is made, the CAD program 41 goes to step ST3. In the step ST3, the CAD program 41 determines whether the process request is an edit request for editing a shape of the component.

When it is determined that the process request is the edit request for editing a shape, the CAD program 41 goes to step ST4 and edits the component shape. Subsequently, in step ST5, the CAD program 41 calculates the component volume by using the volume calculating program 42 and updates the component volume. Then, the CAD program 41 goes back to the step ST2 in order to receive a next process request.

On the other hand, in the step ST3, when the CAD program 41 determines that the process request is not an edit request for editing a shape, the CAD program 41 goes to step ST6 and then determines whether or not the process request is a material allocate request for allocating material to a component.

When it is determined in the step ST6 that the process request is the material allocate request, the CAD program 41 goes to step ST7 and allocates a material to the component interactively with the designer. Then, the CAD program 41 goes back to the step ST2 to receive a next process request.

On the other hand, when it is determined in the step ST6 that the process request is not the material allocate request, the CAD program 41 goes to step ST8 and determines whether or not the process request is a request for starting the design support program 47 in the step ST8.

When it is determined in the step ST8 that the process request is the request for starting the design support program 47, the CAD program 41 goes to step ST9 and starts the design support program 47. Then, the CAD program 41 goes back to the step ST2 to receive a next process request.

On the other hand, when it is determined in the step ST8 that the process request is not the request for starting the design support program 47, the CAD program 41 goes to step ST10 shown in FIG. 9. The CAD program 41 determines whether or not the process request is a request for terminating the design support program in the step ST10.

When it is determined in step ST10 that the process request is the request for terminating the design support program, the CAD program 41 goes to step ST11. The CAD program 41 stores the CAD information of components updated or created as a new component by the edit process in the three-dimensional model database 43. Subsequently, in step ST12, the CAD program 41 notifies the design support program 47 to terminate.

On the other hand, when it is determined in step 10 that the process request is not the request for terminating, the CAD program 41 goes to step ST13. The CAD program 41 execute a process indicated by the process request and then goes to the step ST2 to receive a next process request.

As described above, when the designer initiates an edit request for editing components used for a device, the CAD program 41 edits the components in response to the process request by the designer. When the designer conducts a start request for starting the design support program 47, the CAD program 41 starts the design support program 47. When the designer conducts a terminate request for terminating the design support program 47, the CAD program 41 notifies the design support program 47 to terminate.

It should be noted that the CAD program 41 continues the edit process for editing components, regardless of processing the design support program 47, while the CAD program 41 conducts the start request for starting the design support program 47.

In response to an instruction of the start request from the CAD program 41, the design support program 47, as shown in FIGS. 10, 11 and 12, determines whether or not the instruction from the CAD program 41 is that for terminating a process in step ST11.

When it is determined in the step ST1 that the instruction from the CAD program 41 is a process terminate instruction, the design support program 47 goes to step ST12 and terminates. In this case, working data such as calculation result data that will be described later are cancelled.

On the other hand, when it is determined in step ST11 that the instruction from the CAD program 41 is not the process terminate instruction, that is, when it is determined that the instruction from the CAD program 41 is a start instruction, the design support program 47 goes to step ST13. The design support program 47 sets variable number i equal to '0' (zero) in the step ST13.

Figure 14:
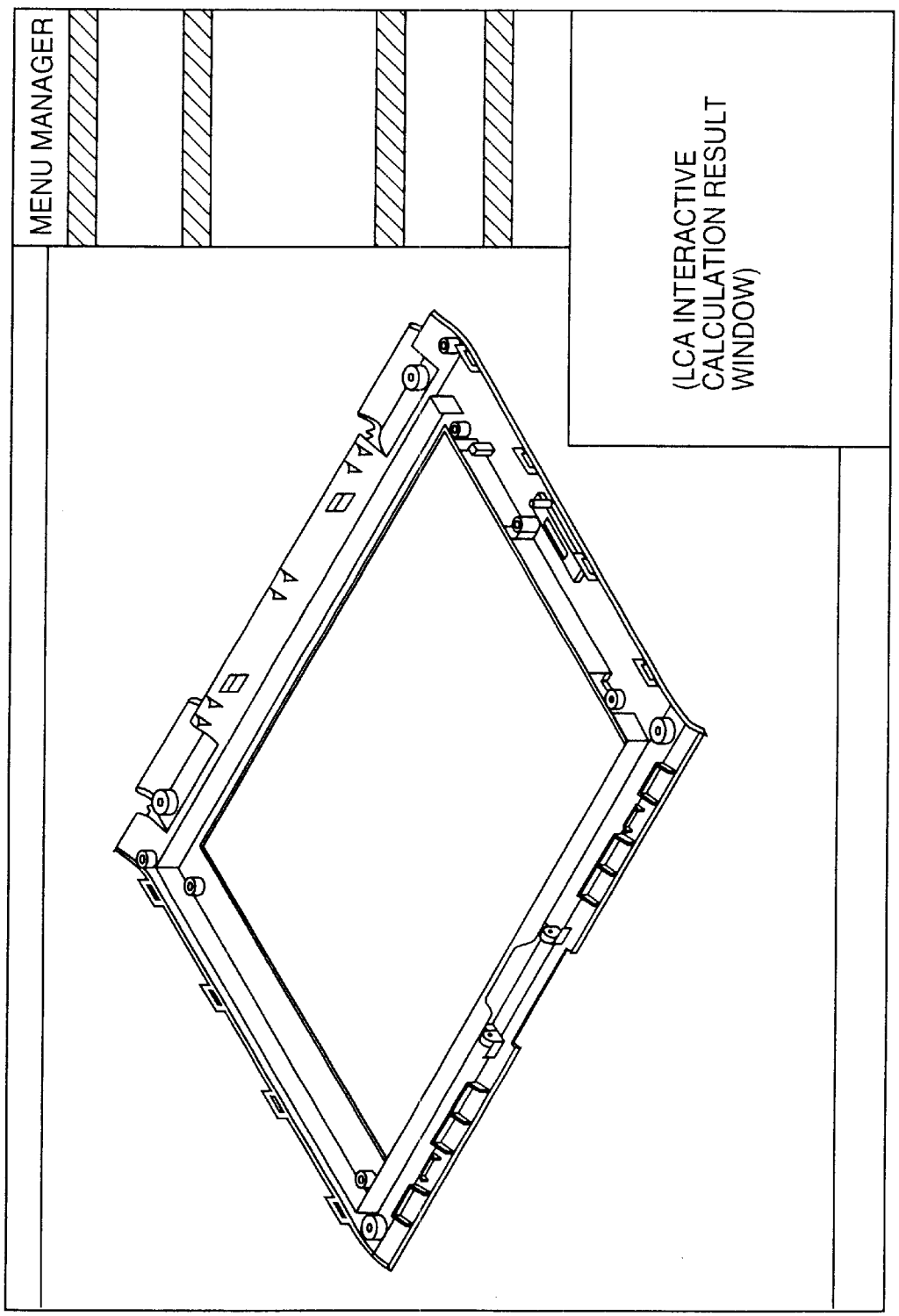
FIG. 14 is a diagram showing the CAD edit window according to the embodiment of the present invention.

Subsequently, in step ST14, the design support program 47 displays LCA (Life Cycle Assessment) information on the CAD edit window. For example, as shown in FIG. 14, the design support program 47 displays an LCA interactive calculation result window at a right bottom of the CAD edit window.

FIG. 15 is a diagram showing the LCA interactive calculation result window according to the embodiment of the present invention. The LCA interactive calculation result window includes a component number display area for an editing component, an experiment number display area, which shows how many times the component is being experimented with, a volume display area for the editing component, a weight display area for the editing component, display areas for $CO_2$ amount produced, $NO_x$ amount produced and $SO_x$ amount produced, "CALCULATE" button, "GRAPH" button, which are located at a bottom of the window, and "END" button located at a right upper corner of the window.

After the design support program 47 displays the LCA interactive calculation result window in the CAD edit window, the design support program 47 waits until the designer operates any one of buttons included in the LCA interactive calculation result window in step ST15. When one button is operated, the design support program 47 goes to step ST16 and determines whether or not the "CALCULATE" button is operated.

When it is determined in step ST16 that "CALCULATE" button is operated, the design support program 47 goes to step ST17. The design support program 47 obtains information including the component number, a material name and volume of the edited component from the CAD program 41 in the step ST17. Subsequently, in step ST18, the design support program 47 accesses the material database 44 by the material name or the material number as a find key and retrieves specific gravity of the edited component.

Subsequently, in step ST 19, the design support program 47 accesses the environmental impact database 45 by using the material name as a find key and obtains the $CO_2$ production rate, $NO_x$ production rate and the $SO_x$ production rate of the edited component.

In step ST20 in FIG. 11, the design support program 47 calculates the weight of the edited component by multiplying the volume obtained in the step ST17 by the specific gravity obtained in the step ST18. Then, the design support program 47 calculates the $CO_2$ amount produced, $NO_x$ amount produced and the $SO_x$ amount produced of the edited component by multiplying the calculated weight by the $CO_2$ production rate, $NO_x$ production rate and the $SO_x$ production rate obtained in the step ST19, respectively.

In step ST21, the variable number i is incremented by 1. In step ST22, the design support program 47 displays the calculated $CO_2$ amount produced, $NO_x$ amount produced and the $SO_x$ amount produced on the LCA interactive calculation result window and stores these amounts as the calculation result data i in a working memory area in the memory unit in FIG. 1. The design support program 47 goes to the step ST15.

That is, as shown in FIG. 15, the LCA interactive calculation result window displays the component number obtained in the step ST17 in the component number display area, the volume obtained in the step ST17 in the volume display area, a value of the variable number i in the experiment number display area, the calculated weight in the weight display area, and the calculated $CO_2$ amount produced, $NO_x$ amount produced and $SO_x$ amount produced in corresponding display areas, respectively.

On the other hand, when it is determined in the step ST16 that the operated button is not the "CALCULATE" button, the design support program 47 goes to step ST23. The design support program 47 determines whether or not the "GRAPH" button is operated in the step ST23.

When it is determined in the step ST23 that the "GRAPH" button is not operated, that is, when the designer operates the "END" button to terminate this process, the design support program 47 goes to step ST24 and is terminated. In this case, the calculation result data stored in the working memory is cleared.

On the other hand, when it is determined in the step ST23 that the "GRAPH" button is operated, the design support program 47 goes to the step ST25. The design support program 47 determines whether or not the value of the variable number i is '1' in the step ST25. When it is determined that the value of the variable number i is '1', the design support program 47 goes to step ST26. The design support program 47 displays an experiment result comparison window for comparing experiments of the LCA in the CAD edit window. Four bars having a standard value '1' and corresponding to the weight, the $CO_2$ amount produced, $NO_x$ amount produced and $SO_x$ amount produced, respectively, are shown in a single bar graph on the experiment result comparison window. The design support program 47 goes back to the step ST15.

In the step ST15, when it is determined that the value of the variable number is not '1', the design support program 47 goes to step ST27. The design support program 47 retrieves the calculation result data stored in the working memory in the step ST27. In step ST28 in FIG. 12, the design support program 47 calculates ratios of the calculation result data i (i=2, 3 . . . ) to the first calculation result data i (i=1). In step ST29, the design support program 47 displays the experiment result comparison window for comparing experiments of the LCA in the CAD edit window. Four bars having a standard value '1' and corresponding to the weight, the $CO_2$ amount produced, $NO_x$ amount produced and $SO_x$ amount produced, respectively, are shown in the bar graph on the experiment result comparison window. The design support program 47 goes back to the step ST15.

Figure 17:
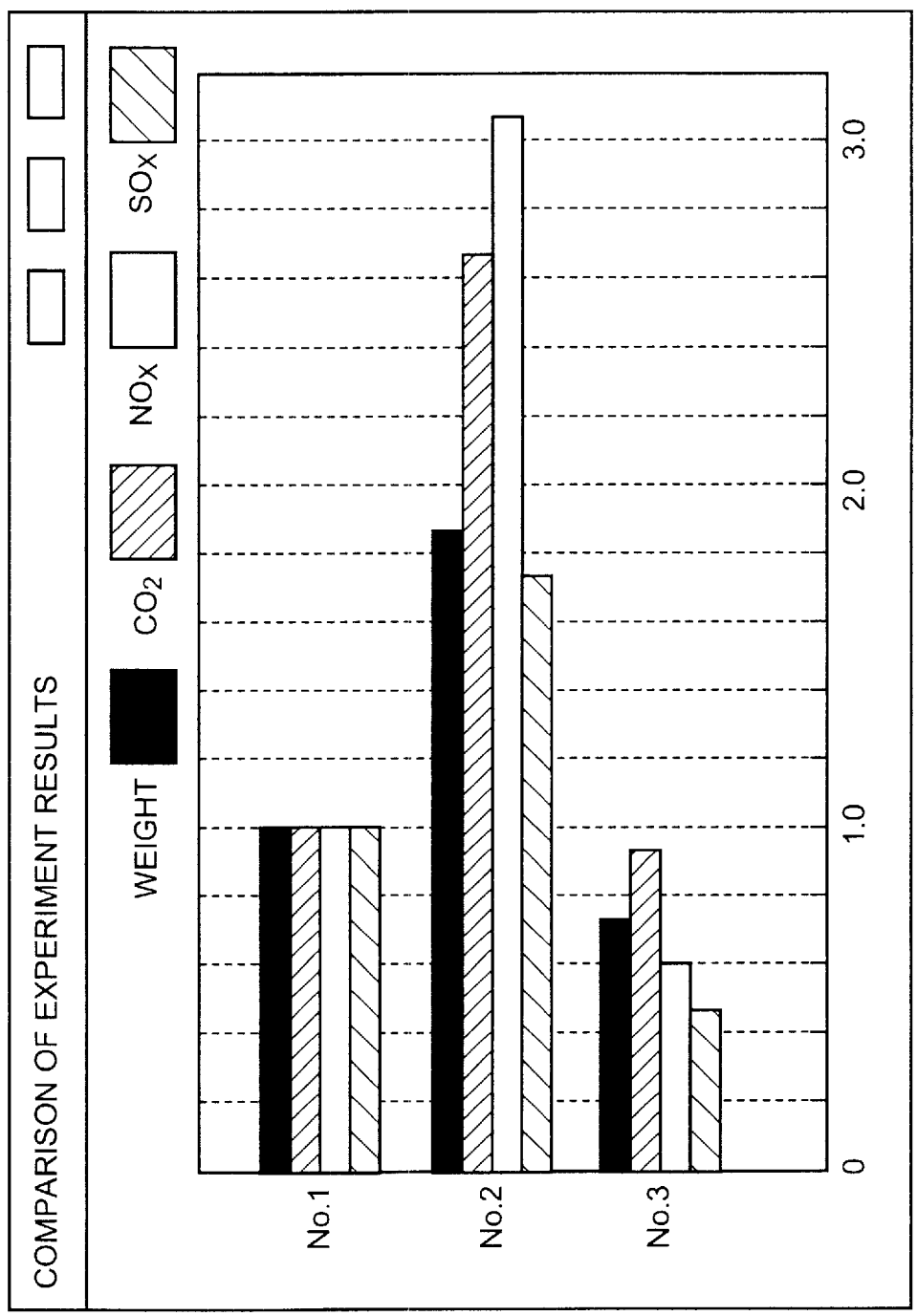
FIG. 17 is a diagram showing a comparison of experiment results window according to the embodiment of the present invention.

As described above, when the "GRAPH" button is operated, the $CO_2$ amount produced, $NO_x$ amount produced and $SO_x$ amount produced are calculated in response to each "CALCULATE" button operation and then the three ratios of the $CO_2$ amount produced, $NO_x$ amount produced and $SO_x$ amount produced to the first $CO_2$ amount produced, the first $NO_x$ amount produced and the first the $SO_x$ amount produced, respectively, are calculated and displayed in the bar graph on the experiment result comparison window as shown in FIG. 17.

Figure 18:
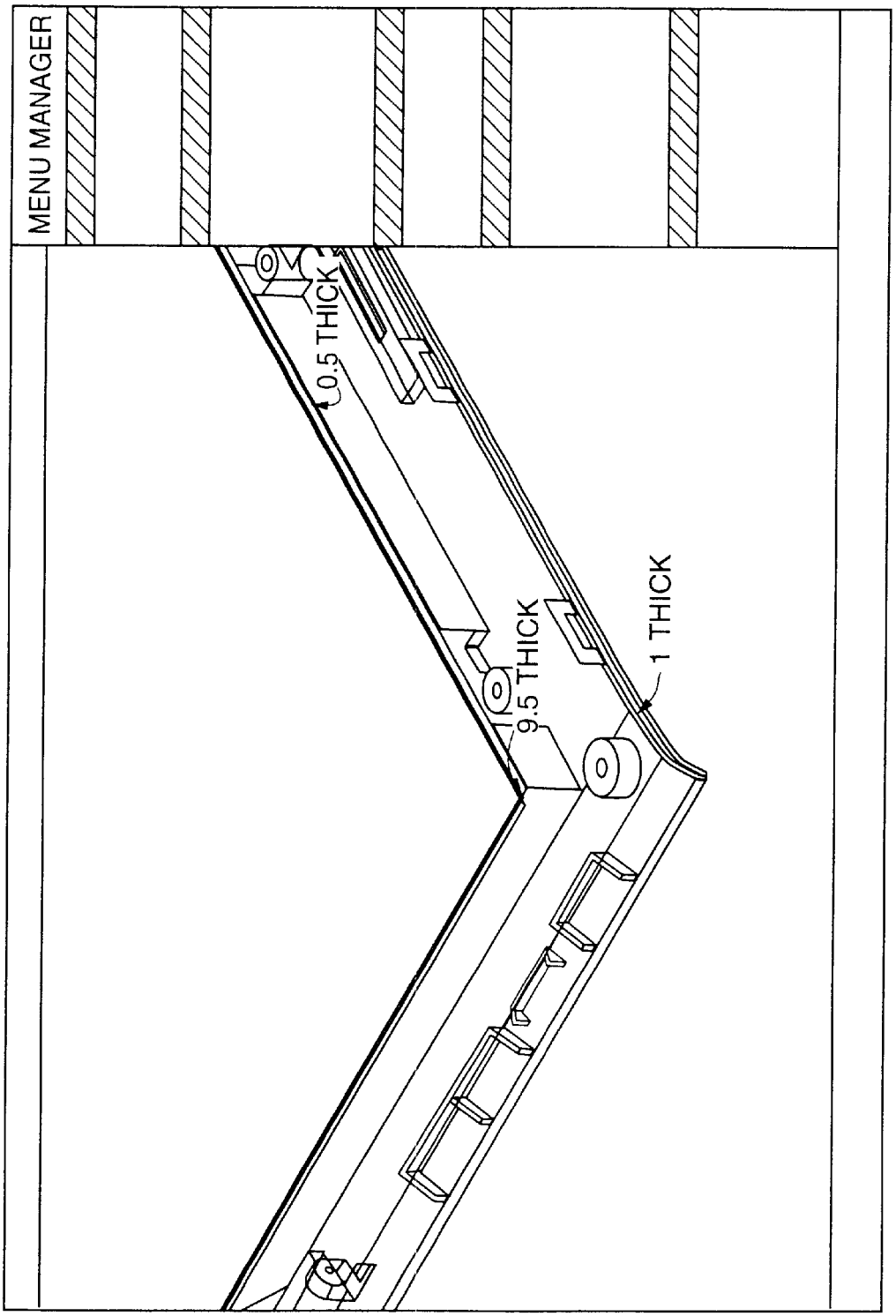
FIG. 18 is a diagram showing the CAD edit window according to the embodiment of the present invention.

While referring to the experiment result comparison in the bar graph, the designer can change the thickness and the material of the edited component by using, for example, the CAD edit window shown in FIG. 18. Therefore, it is possible to simultaneously change and improve the weight and the $CO_2$ amount produced, $NO_x$ amount produced and $SO_x$ amount produced.

As described above, when the CAD program 41 indicates the edited component and starts the design support program 47, the design support program 47 calculates the weight and the $CO_2$ amount produced, $NO_x$ amount produced and $SO_x$ amount produced of the edited component and displays them on the LCA interactive calculation result window in FIG. 16. In addition, the design support program 47 calculates those values each time the CAD program 41 changes and displays those values on the experiment result comparison window in FIG. 17. Thus, the design support program 47 supports the CAD design by considering the environmental impact.

In the flowcharts in FIG. 10 and FIG. 11, when the CAD program 41 completes editing the component, the design support program 47 clears the calculation result data stored in the working memory. But alternatively, the calculation result data may be stored by associating with the component ID. After that, when the same component is edited again, the bar graph additionally including previous calculation results may be displayed in the experiment result comparison window.

An assessment process executed by the device assessment program 48 will now be described.

The design support program 47 supports the CAD system designing components used for the device by assessing environmental impact. The device assessment program 48 supports assessing the environmental impact of the entire device designed by the CAD system.

FIGS. 19, 20, 21, 22 and 23 are flowcharts for explaining the assessment process executed by the device assessment program 48 according to the present invention. The assessment process according to the present invention as executed for a device designed by the CAD system will now be described with reference to these figures.

When the device assessment program 48 is started by the designer as a user, the device assessment program 48 determines the device to assess interactively with the designer in step ST41.

Subsequently, in step ST42, the device assessment program 48 obtains the CAD information of the determined device from the three-dimensional model database 43. Based on the CAD information, the device assessment program 48 displays the three-dimensional model of the determined device on a three-dimensional model display window shown in FIG. 24 on the display unit 65 in FIG. 1.

Figure 24:
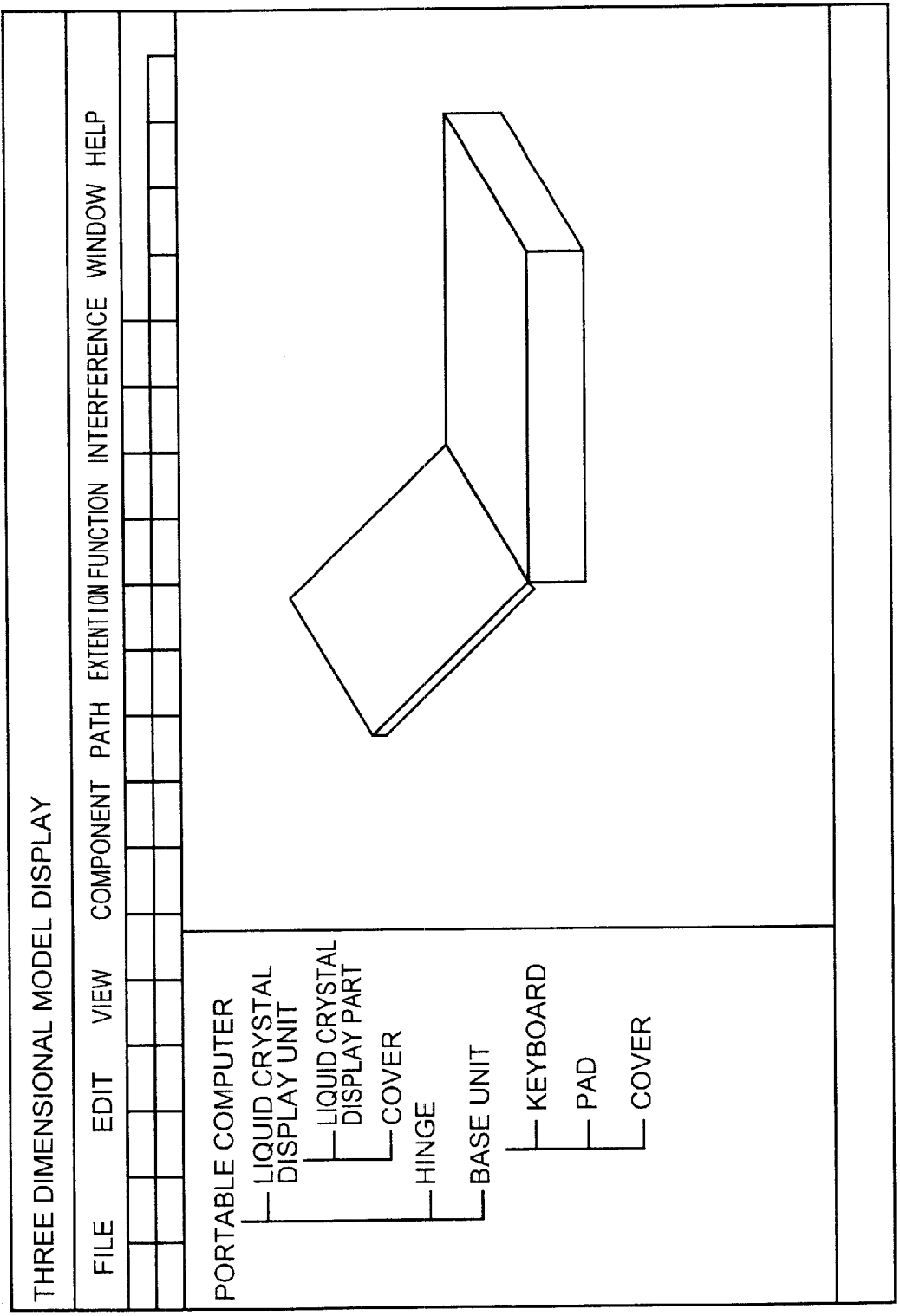
FIG. 24 is a diagram showing a setting window for calculating a decomposition time according to the embodiment of the present invention.

In FIG. 24, it is assumed that a portable computer such as a notebook computer is selected by the designer. When the portable computer is displayed on the three-dimensional model display window, the "PORTABLE COMPUTER" as a parent has a "LIQUID CRYSTAL DISPLAY UNIT", a "HINGE" and a "BASE UNIT" as children. The "LIQUID CRYSTAL DISPLAY UNIT" has a "LIQUID CRYSTAL DISPLAY PART" and a "COVER" as children. The "BASE UNIT" has a "KEYBOARD", a "PAD" and a "COVER" as children. The components of the determined device are displayed in a tree structure in the three-dimensional model display window.

In step ST43, the device assessment program 48 accesses the material database 44 by the material name indicated by the CAD information obtained in the step ST42 and obtains specific gravity of the material of each component used for the determined device. Subsequently, in step ST44, the device assessment program 48 calculates the weight of each component by multiplying the obtained specific gravity by the volume of each component indicated by the obtained CAD information.

In step ST45, the device assessment program 48 adds all weights calculated in the step ST44 to obtain the total weight of the determined device. Also, the device assessment program 48 adds all volumes to obtain the total volume of the determined device.

In step ST46, the device assessment program 48 executes a decomposition time calculate process for calculating a decomposition time (that will be described in FIG. 20 and 21), a device compare process for assessing the determined device by comparing with another device (that will be described in FIG. 22) and a table create process for creating an environmental impact information table of the determined device (that will be described in FIG. 23).

The decomposition time calculate process will now be described with reference to FIGS. 20 and 21.

Figure 20:
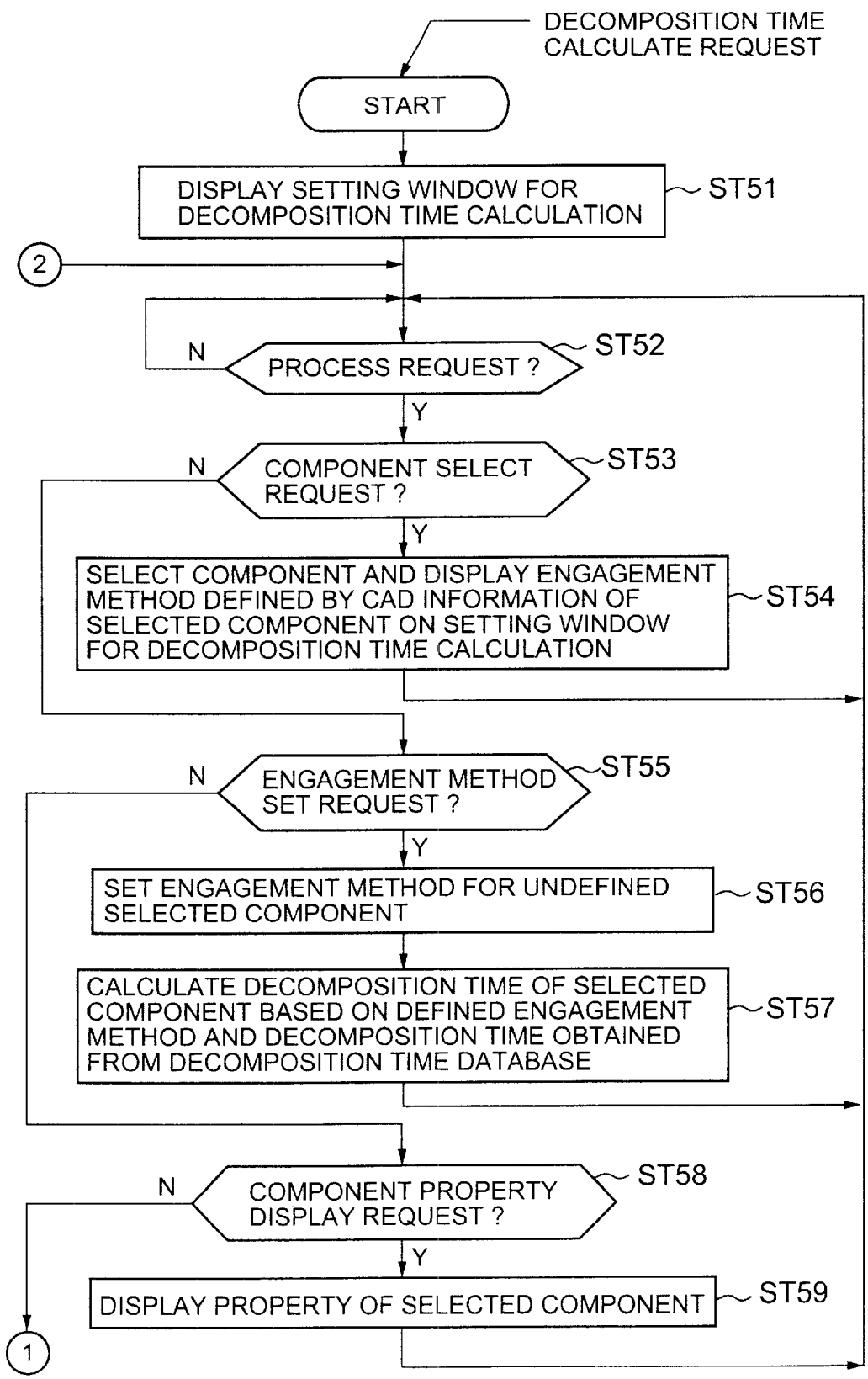
FIG. 20 is a flowchart for explaining the process executed by the device assessment apparatus according to the embodiment of the present invention.

When the decomposition time calculate process is initiated by the designer, the device assessment program 48 displays a setting window for calculating a decomposition time in step ST51 in FIG. 20 and executes the decomposition time calculate process.

Figure 25:
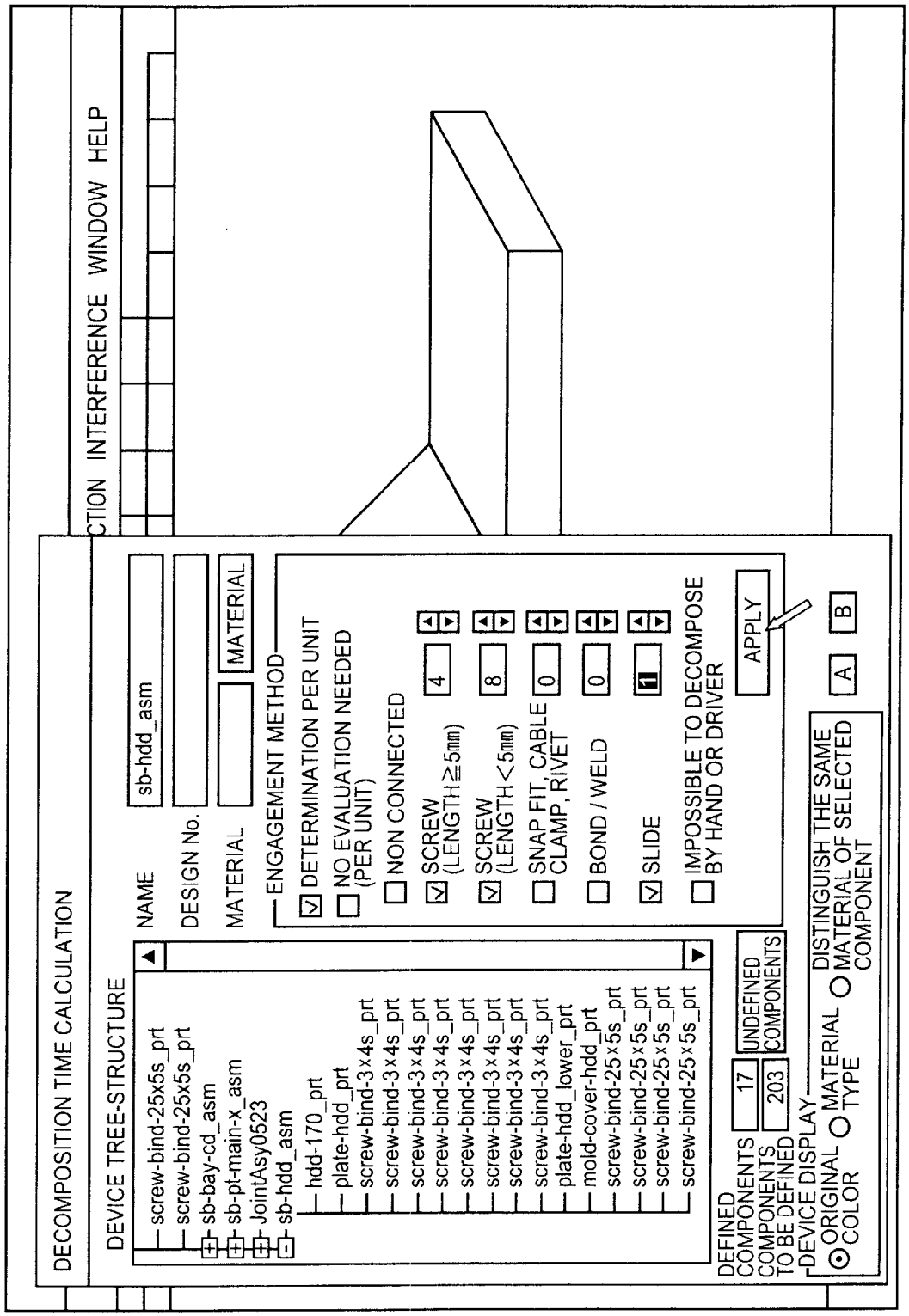
FIG. 25 is a diagram showing the setting window for calculating a decomposition time according to the embodiment of the present invention.

FIG. 25 is a diagram showing the setting window for calculating a decomposition time according to the embodiment of the present invention. The setting window includes a device tree-structure display area to display components of the determined device in a tree structure, a component display area to display the name, the design number and the material of the component selected from the device tree-structure, a engagement method setting area to set an engagement method of the component selected from the tree-structure display area, a selecting area to select a device display mode, a property button to display a property of the selected component ("A" button shown in FIG. 25) and an output button to output a comparison assessment ("B" button shown in FIG. 25).

In step ST52, the decomposition time calculate process waits for a next process request from the designer. When the next process request is received, the decomposition time calculate process goes to step ST53. In the step ST 53, it is determined whether the process request is a select request for selecting a component.

That is, when the designer selects a component to process, the designer clicks the component name displayed in the device tree-structure display area. The setting window for calculating a decomposition time may provide an input area to input the component name. It is determined whether or not the component name in the device tree-structure display area is clicked, that is, it is determined whether or not a component select indication is conducted.

In the step ST53, when it is determined that a component select request is conducted, the decomposition time calculate process goes to step ST54. In the step ST54, the component selected by the designer is set to process and the engagement method defined by the CAD information of the selected component are displayed in the setting window for calculating a decomposition time. Also, the composition name, the design number and the material of the selected component is displayed in the setting window. The decomposition time calculate process goes back to the step ST52.

On the other hand, in the step ST53, when it is determined that the process request by the designer is not the component select request, the decomposition time calculate process goes to step ST55. In the step ST55, it is determined whether or not the process request by the designer is an engagement method define request for a selected component. When it is determined that the process request by the designer is an engagement method define request for the selected component, the decomposition time calculate process goes to step ST56. In the step ST56, the engagement method for a component undefined in the CAD information is defined interactively by the designer through the setting area for engagement methods provided in the setting window for setting a decomposition time.

The setting window for calculating a decomposition time shown in FIG. 25, as engagement methods, provides many options to set the number of long screws, the number of short screws, the number of snap fits, cable clamps or rivets, the number of bonds or welds, the number of slides and to check whether or not a special tool is needed. In the step ST56, when another engagement method other than those above methods defined by the CAD information is to be used, another engagement method is determined interactively by the designer.

When another engagement method undefined by the CAD information is determined, the decomposition time database 46 is accessed by a working item corresponding to the determined engagement method as a find key so that the decomposition time required for the determined engagement method is obtained. The decomposition time is multiplied by working steps (the number of engagements) for each selected option or determined engagement and the multiplied decomposition time is summed so that the total decomposition time of the selected component is calculated.

The steps ST55 through ST57 are repeated. Thus, the total decomposition time of each component for the device determined in the step ST41 is obtained. In the setting window for calculating a decomposition time shown in FIG. 25, the number of components for the determined device and the number of components where the engagement method is applied are displayed. Hence, it is possible for the designer to define the engagement method for each component used for the determined device and to confirm the defined engagement method simultaneously. And the decomposition time is calculated based on the defined engagement method.

Figure 26:
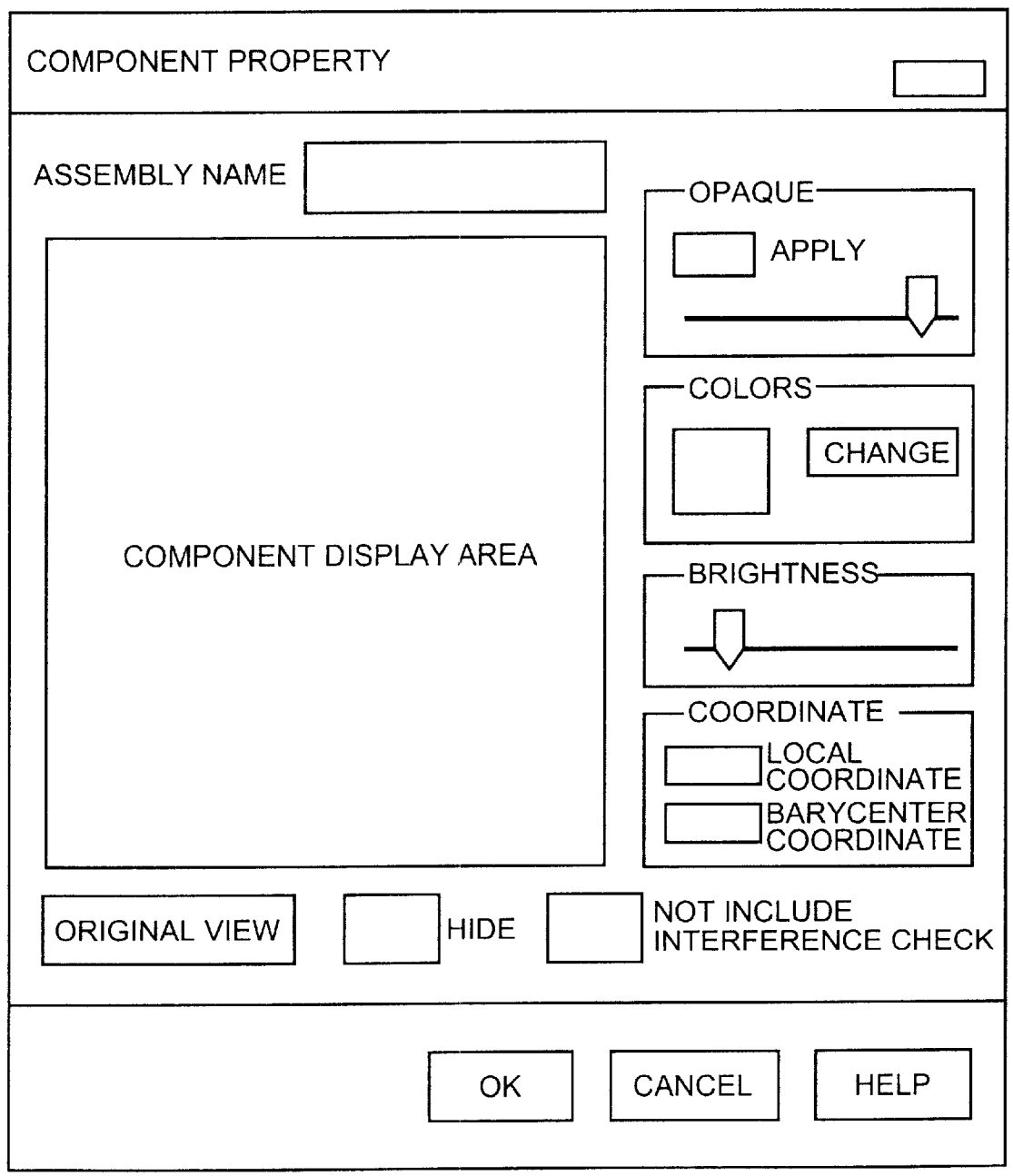
FIG. 26 is a diagram showing a component property window according to the embodiment of the present invention.

On the other hand, in the step ST55, when it is determined that the process request by the designer is not an engagement method define request for the selected component, the decomposition time calculate process goes to step ST58. In the step ST58, it is determined whether or not the process request by the designer is a component property display request by the user operating the component property button ("A" button in FIG. 25). When it is determined that the process request is the component property display request, the process goes to step ST59. In the step ST59, properties of the selected component including the three-dimensional model and display colors are displayed in a component property display shown in FIG. 26. The process goes back to the step ST52.

Consequently, it is possible for the designer to obtain the detail information of the selected component from the component property display.

Figure 21:
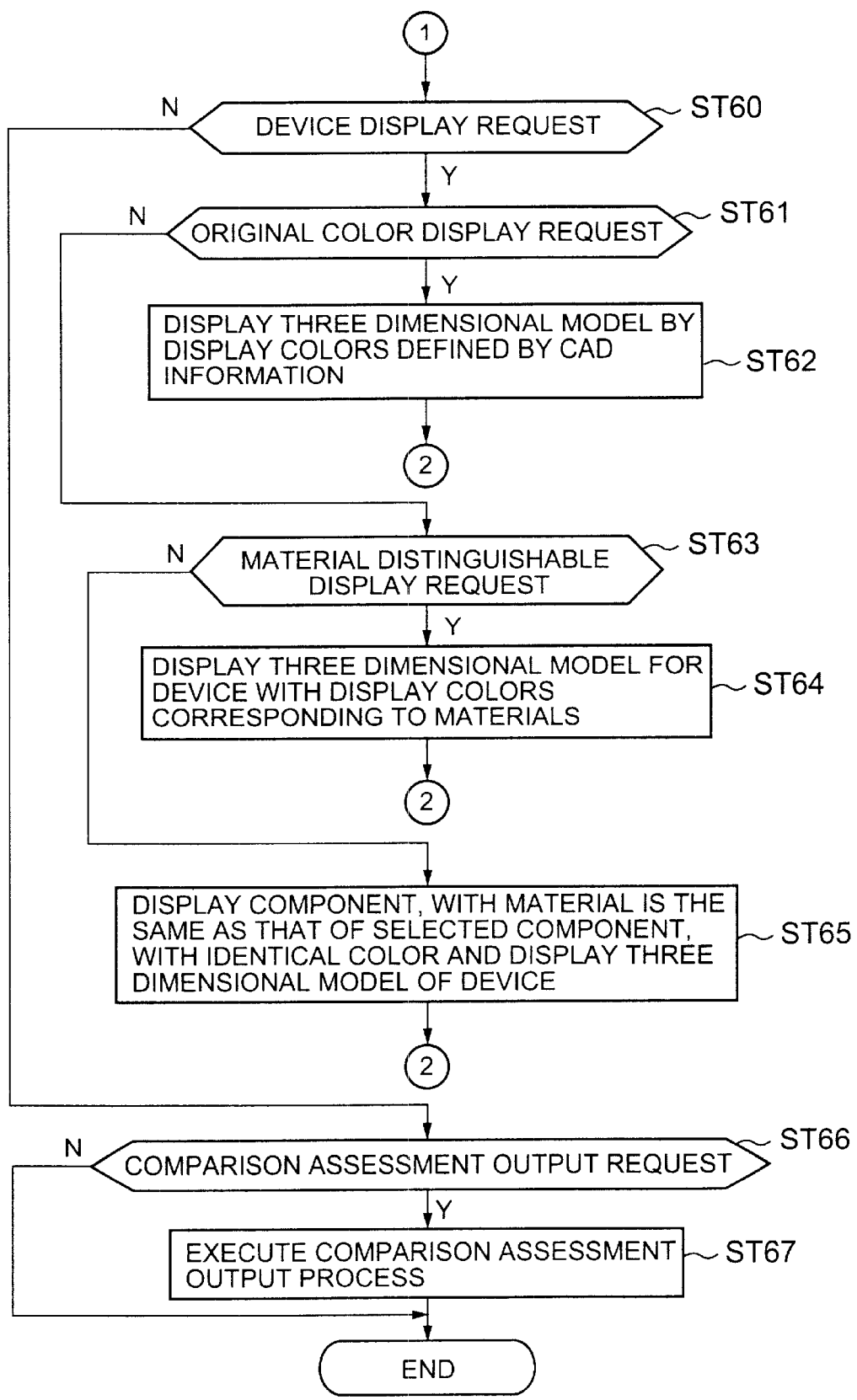
FIG. 21 is a flowchart for explaining the process executed by the device assessment apparatus according to the embodiment of the present invention.

On the other hand, in the step ST58, when it is determined that the process request is not the component property display request, the process goes to step ST60 in FIG. 21. In the step ST60, it is determined whether or not the process request by the designer is a device display request. When it is determined that the process request by the designer is the device display request, it is determined whether or not the device display request indicates an original color display mode in step ST61.

As shown in FIG. 25, several display modes are provided to display the determined device. In the original color display mode, the three-dimensional model of the determined device is displayed using original colors defined by the CAD program 41. In a material distinguishable display mode, the three-dimensional model of the determined device is displayed using colors distinguishing materials, that is, each color corresponding to each material. In another mode, the three-dimensional model of the determined device is displayed in which the same material of the selected component is shown by an identical color and other materials are shown by another color (or other colors other than the identical color for the selected component). In the step ST61, it is determined whether or not the display request by the designer indicates the original color display mode.

When it is determined in the step ST61 that the display request by the designer indicates the original color display mode, the process goes to step ST62. In the step ST62, the three-dimensional model of the determined device is displayed by the original colors defined by the CAD program 41. The process goes back to the step ST52.

Figure 27:
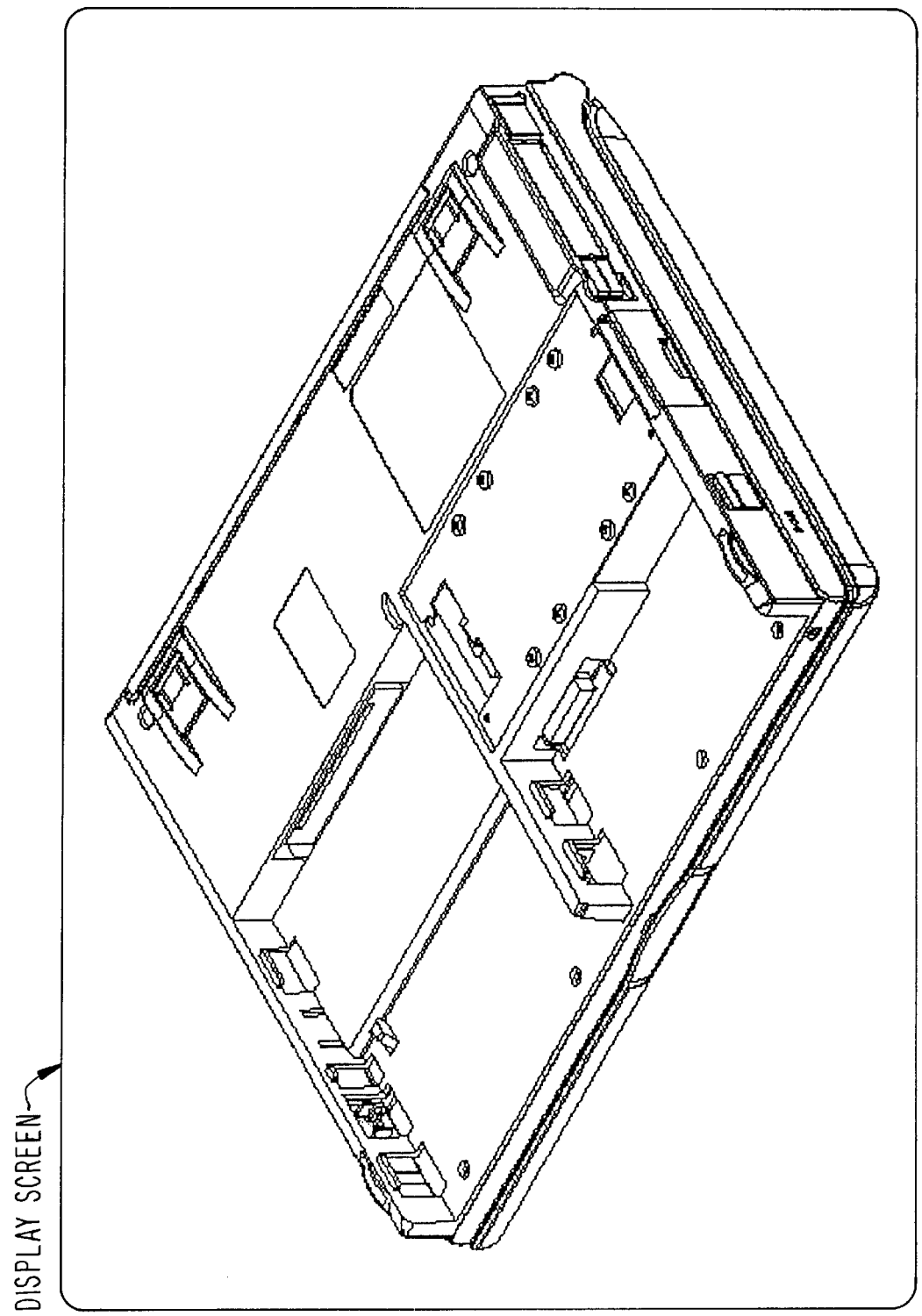
FIG. 27 is a diagram showing a three-dimensional model of a device in a display process according to the embodiment of the present invention.

That is, as shown in FIG. 27, the three-dimensional mode is displayed by the original colors defined by the CAD program 41. In practice, the three-dimensional model is color-displayed.

On the other hand, in the step ST61, when it is determined that the display request by the designer indicates the original color display mode, the process goes to step ST63. In the step ST63, it is determined whether or not the device display request indicates the material distinguishable display mode. When it is determined that the device display request indicates the material distinguishable display mode, the process goes to step ST64. In the step ST64, the three-dimensional model of the determined device is displayed using colors distinguishing materials. The process goes back to the step ST52.

Figure 28:
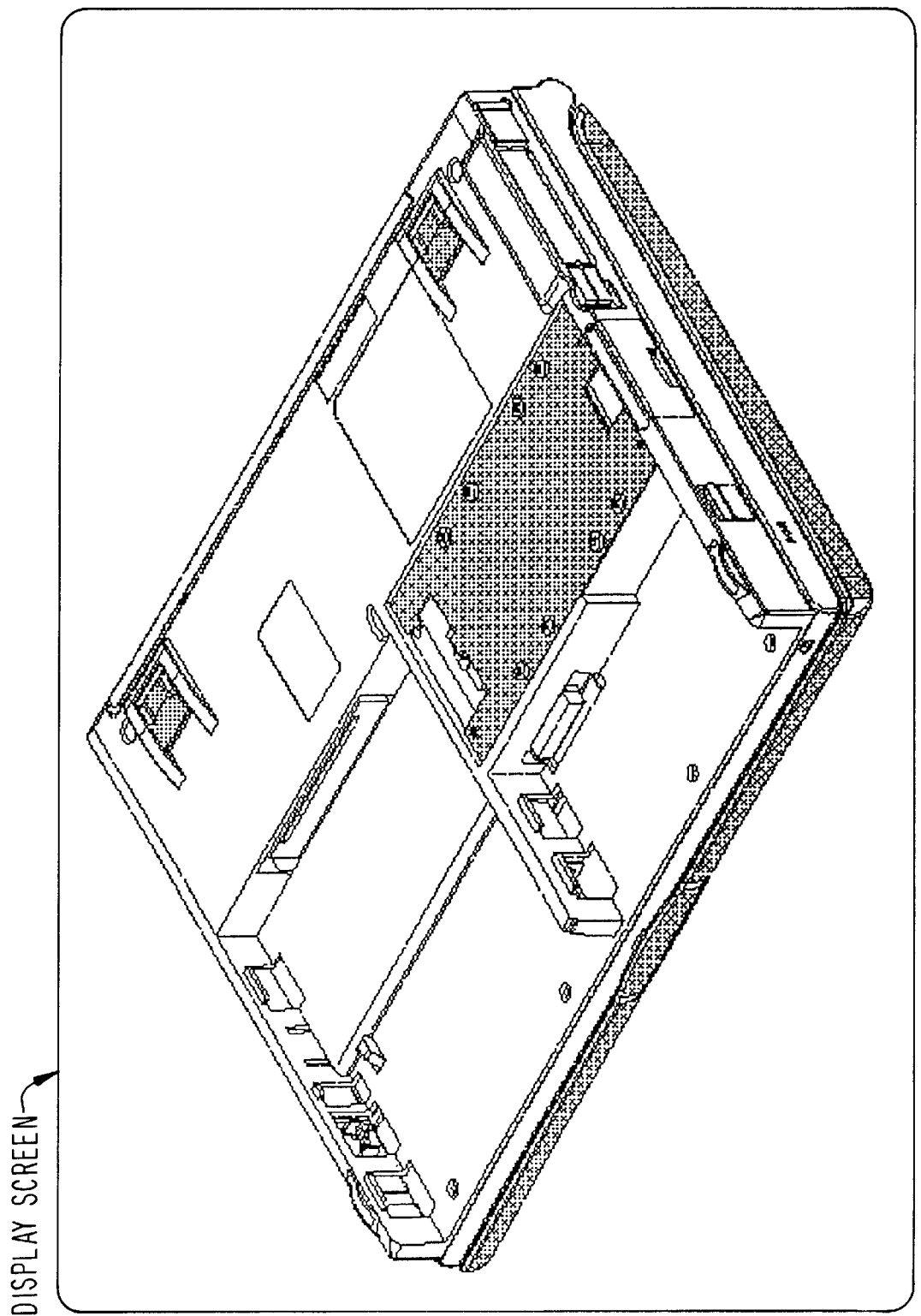
FIG. 28 is a diagram showing the three-dimensional model of the device in the display process according to the embodiment of the present invention.

That is, as shown in FIG. 28, the three-dimensional model of the determined device is displayed using colors distinguishing materials. In practice, the three-dimensional model is color-displayed.

On the other hand, in the step ST63, when it is determined that the device display request does not indicate the material distinguishable display mode, the process goes to step ST65. In the step ST65, the three-dimensional model of the determined device is displayed in which the same material of the selected component is shown by an identical color and other materials are shown by another single color. The process goes back to the step ST52.

Figure 29:
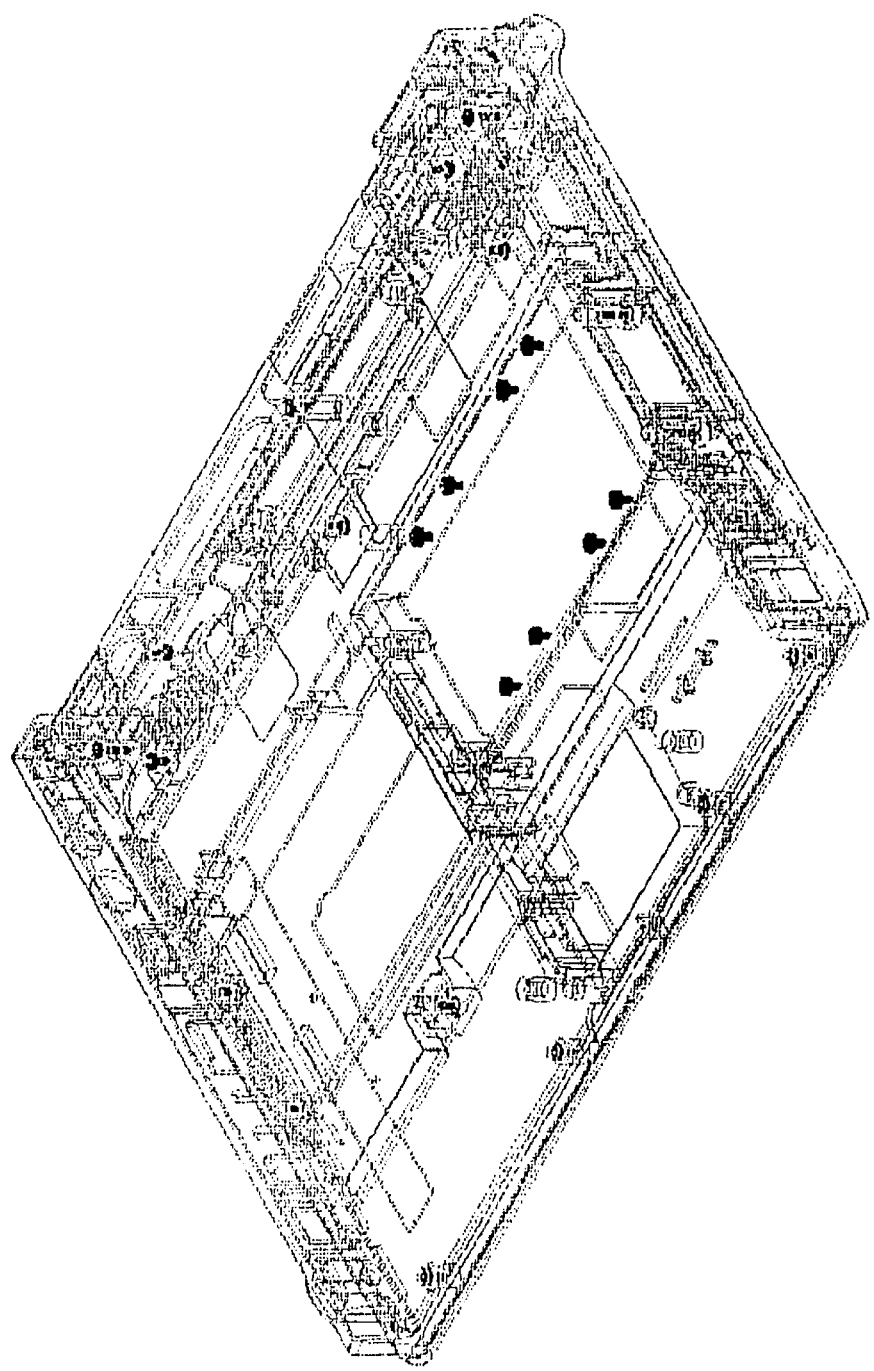
FIG. 29 is a diagram showing the three-dimensional model of the device in the display process according to the embodiment of the present invention.

That is, as shown in FIG. 29, the three-dimensional model of the determined device is displayed in which the same material of the selected component is shown by an identical color and other materials are shown by another single color. In practice, the three-dimensional model is color-displayed.

In FIG. 29, it is assumed that the selected component is a screw. For example, components having the same material of the screw are shown in the same color and other components having materials being different from the material of the screw are shown in another single color. When components having the same material of the screw are located inside of the determined device, a material color of a component hiding the selected component may be translucent.

The device assessment program 48 determines the display mode based on the instruction by the designer from the selecting area of the device display mode provided in the setting window for calculating a decomposition time. Accordingly, the three-dimensional model of the determined device is displayed selectively using original colors defined by the CAD program 41, using colors distinguishing materials, or using an identical color for the same material of the selected component and another single color for other materials.

When there are components made of materials which are not allocated, the components are shown using a special color. The special color can be selectively defined in the display mode. When a component selected by the designer is not used for the determined device, the button for distinguishing the same material of the selected component cannot be operated.

Materials affect the environmental impact of a device. Thus, using present invention makes it possible for the designer to know where components including materials causing large environmental impacts are located. It is possible for the designer to know how to change which materials and to know how much environmental impact can be reduced.

On the other hand, in the step ST60 in FIG. 21, when it is determined that the process request by the designer is not the device display request, the process goes to step ST66. In the step ST66, it is determined whether or not the process request by the designer is a comparison assessment output process executed by the designer operating the comparison assessment ("B" button shown in FIG. 25). When it is determined that the process request by the designer is a comparison assessment output process, the process goes to step ST67. In the step ST67, the comparison assessment output process that will be described later is executed.

On the other hand, in the step ST66, when it is determined that the process request by the designer is not the comparison assessment output process, that is, the process request by the designer is a terminate request, the decomposition time calculate process is terminated.

The comparison assessment output process executed in the step ST67 will now be described with reference to FIG. 22 and FIG. 23.

The comparison assessment output process is executed by operating the comparison assessment button ("B" button in FIG. 25). When the decomposition time of each component used for the determined device is obtained by repeating the steps ST53 through ST57 in FIG. 20 and FIG. 21, the comparison assessment button may be operated by the designer.

Figure 22:
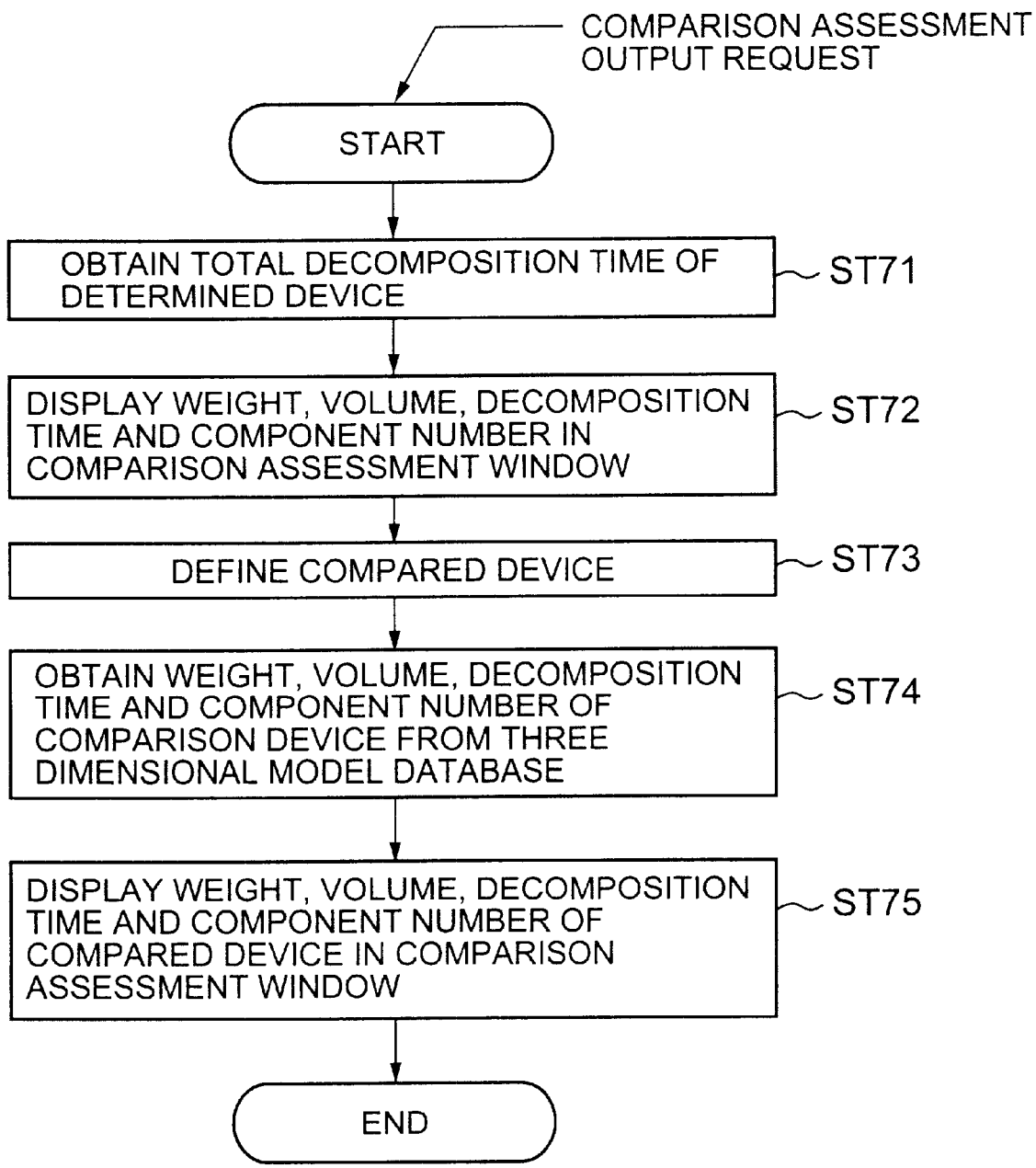
FIG. 22 is a flowchart for explaining the process executed by the device assessment apparatus *i=according to the embodiment of the present invention.
Figure 23:
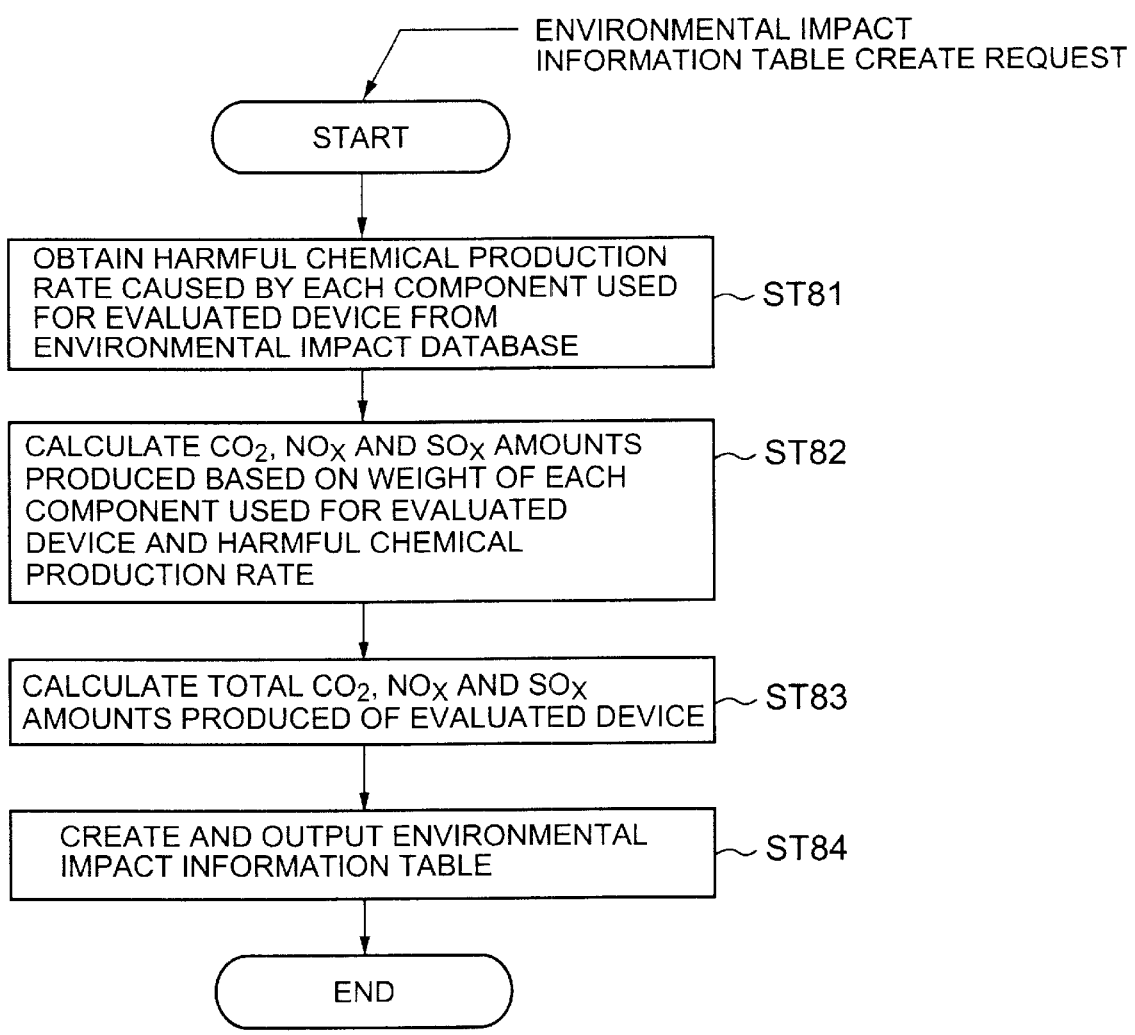
FIG. 23 is a flowchart for explaining the process executed by the device assessment apparatus according to the embodiment of the present invention.

As described above, when the comparison assessment output process is conducted, the device assessment program 48 obtains total decomposition time of all components used for the determined device in step ST71 in FIG. 22.

Figure 30:
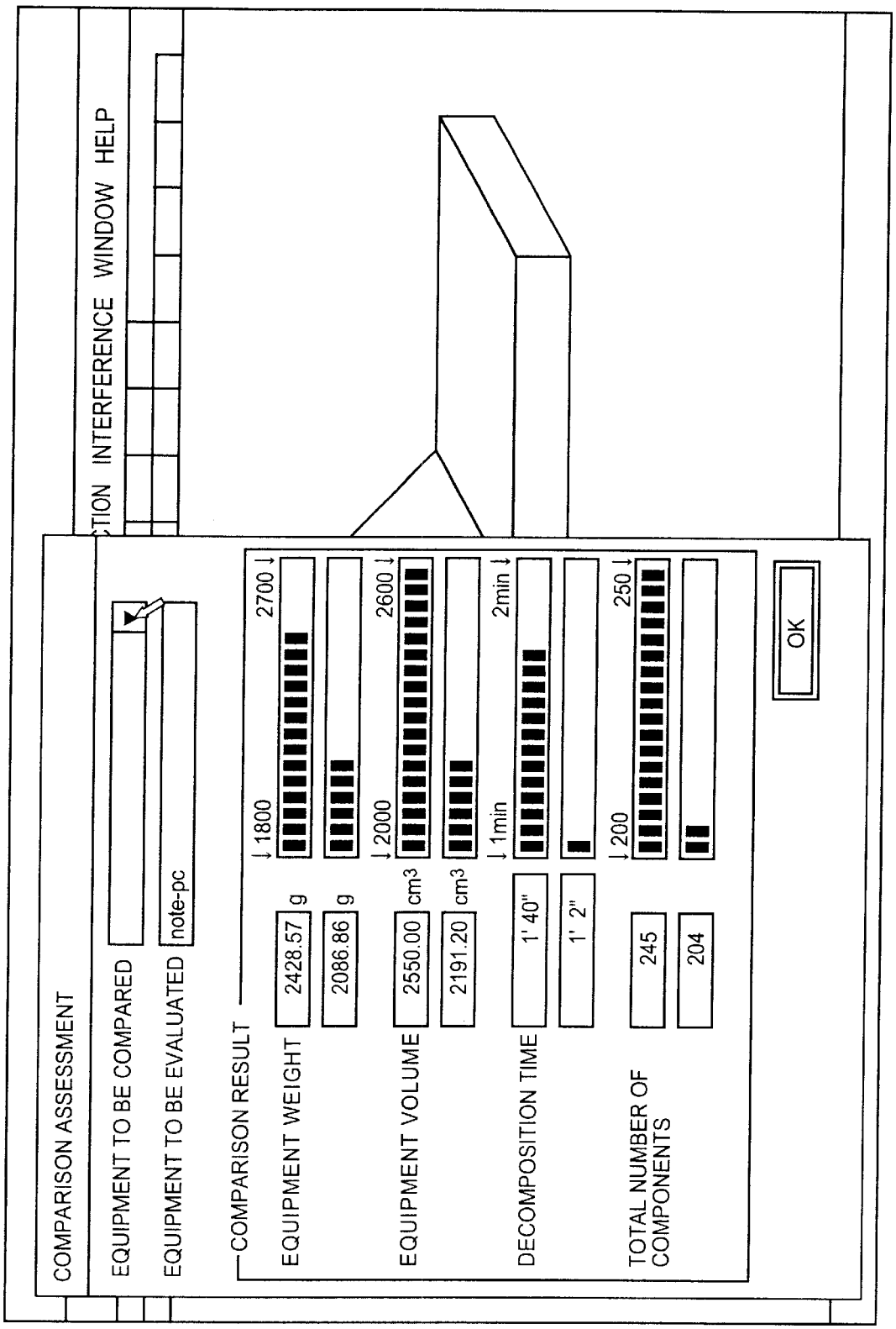
FIG. 30 is a diagram showing a comparison assessment window according to the embodiment of the present invention.

In step ST72, a comparison assessment window as shown in FIG. 30 is displayed and the weight, the volume, the decomposition time and the number of components of the determined device are displayed. For the sake of convenience, the comparison assessment window in FIG. 30 shows all information above. However, the information above is not shown yet in the step ST72.

Subsequently, in step ST73, another device (hereinafter called a compared device) that is to be compared to the determined device (hereinafter called a evaluated device) is defined interactively by the designer through the comparison assessment window. In step ST74, the weight, the volume, the decomposition time and the number of components of the compared device are retrieved from the three-dimensional model database 43.

It should be noted that the weight, the volume, the decomposition time and the number of components of the evaluated device are stored with its identical information such as a device name or a device number in the three-dimensional model database 43. In the same manner, the information above of the compared device defined in the step ST73 is also stored in the three-dimensional model database 43 when the compared device is assessed. In step ST74, the information above of the compared device is obtained by accessing the three-dimensional model database 43.

Thereafter, in step ST75, the weight, the volume, the decomposition time and the number of components are shown in the comparison assessment window.

Thus, the weight, the volume, the decomposition time and the number of components of the evaluated device and those of the compared device are displayed while corresponding with each other.

By referring to the comparison assessment window, the designer can consider easily and effectively whether a newly designed device is improved in its decomposability, reduced in its weight or minimized more or is simplified in its configuration.

By improving the decomposability, reducing the weight, minimizing the size, simplifying the configuration of the device, refuse amount produced by the device and the environmental impact of the device can be reduced. The designer can assess the environmental impact of the device effectively by using the comparison assessment window.

On the other hand, when an environmental impact information table create request is initiated through a menu in another window (not shown), the device assessment program 48 creates the environmental impact information table shown in FIG. 31 and outputs the table to the display unit 65 in FIG. 1 or prints out the table on the output unit 63 in FIG. 1.

That is, when the environmental impact information table create request is initiated for the evaluated device, the device assessment program 48 accesses the environmental impact database 45 by using the material name or the material number of each component used for the evaluated device as a find key and obtains the $CO_2$, $NO_x$ and $SO_x$ production rates of each component in step ST81.

Figure 19:
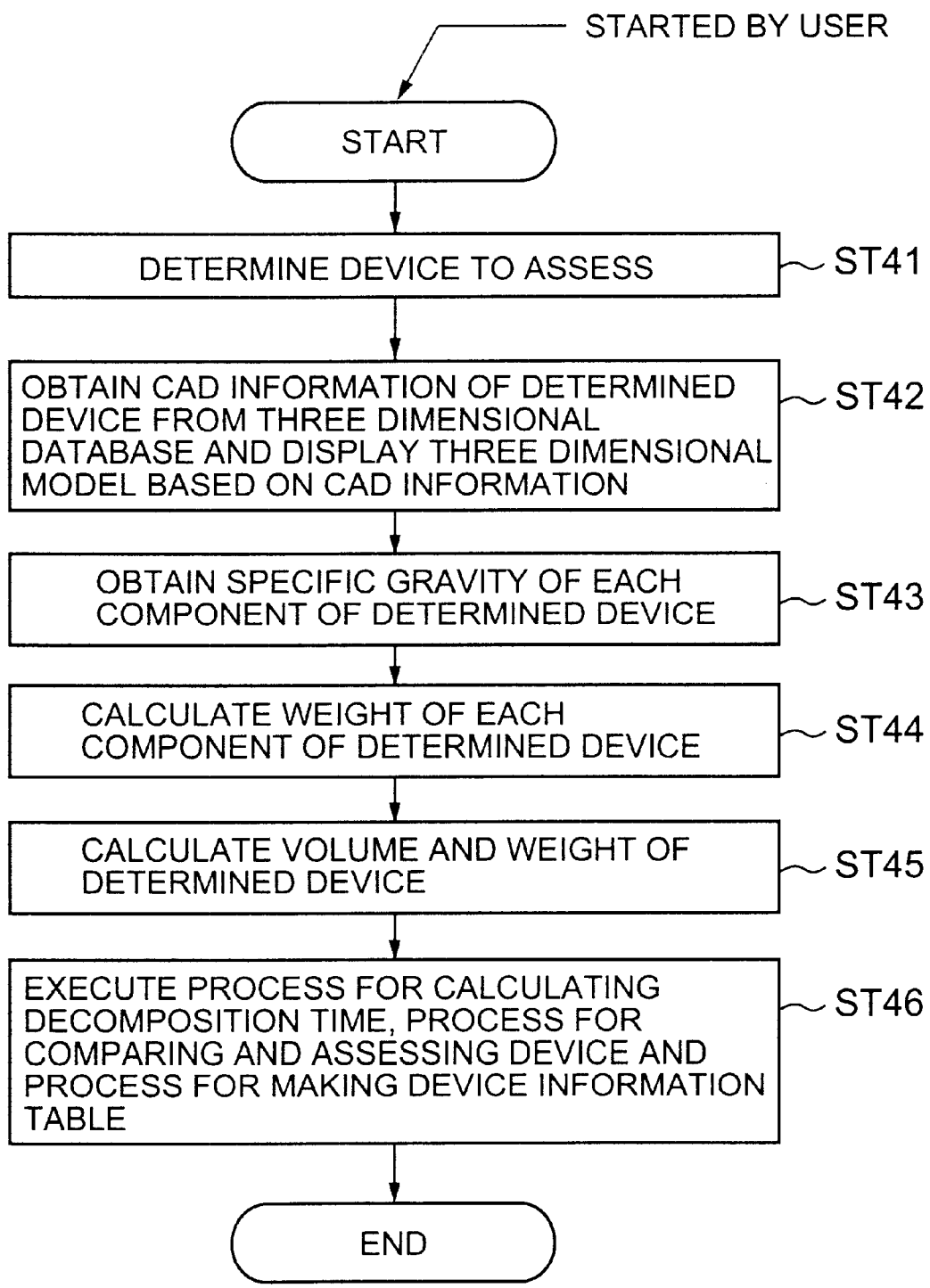
FIG. 19 is a flowchart for explaining a process executed by a device assessment apparatus according to the embodiment of the present invention.

Subsequently, in step ST82, the weight of each component used for the evaluated device, which is obtained in the step ST44 in FIG. 19, is multiplied by the $CO_2$, $NO_z$ and $SO_x$ production rates of each component in the step ST81 so that the $CO_2$, $NO_z$ and $SO_x$ amounts produced by each component is calculated.

In step ST83, total $CO_2$, $NO_z$ and $SO_x$ amounts produced of the entire evaluated device are calculated.

In step ST84, based on the calculations in the steps ST82 and ST83, the environmental impact information table of the evaluated device is provided as shown in FIG. 31.

As described in FIG. 31, the $CO_2$, $NO_z$ and $SO_x$ amounts produced when the evaluated device is manufactured are recorded in the created environmental impact information table. Also, the $CO_2$, $NO_z$ and $SO_x$ amounts produced when each component of the evaluated device is manufactured are recorded in the created environmental impact information table. The designer can obtain the detailed information from the table and recognize which component produces a large amount of $CO_2$, $NO_z$ or $SO_x$.

The device assessment program 48 may calculate the $CO_2$, $NO_z$ and $SO_x$ amounts produced when each component of the evaluated device is recycled and record the calculated $CO_2$, $NO_z$ and $SO_x$ amounts produced in the environmental impact information table. In this case, the environmental impact database 45 may manage the production rates per unit of $CO_2$, $NO_z$ and $SO_x$ of each component when the component is recycled.

As described above, the device assessment program 48 calculates the $CO_2$, $NO_z$ and $SO_x$ amounts produced that cause the environmental impact of the evaluated device. Also, the device assessment program 48 outputs the above harmful chemical information. Moreover, the device assessment program 48 estimates the recycle potential of the evaluated device and outputs the result.

Figure 32:
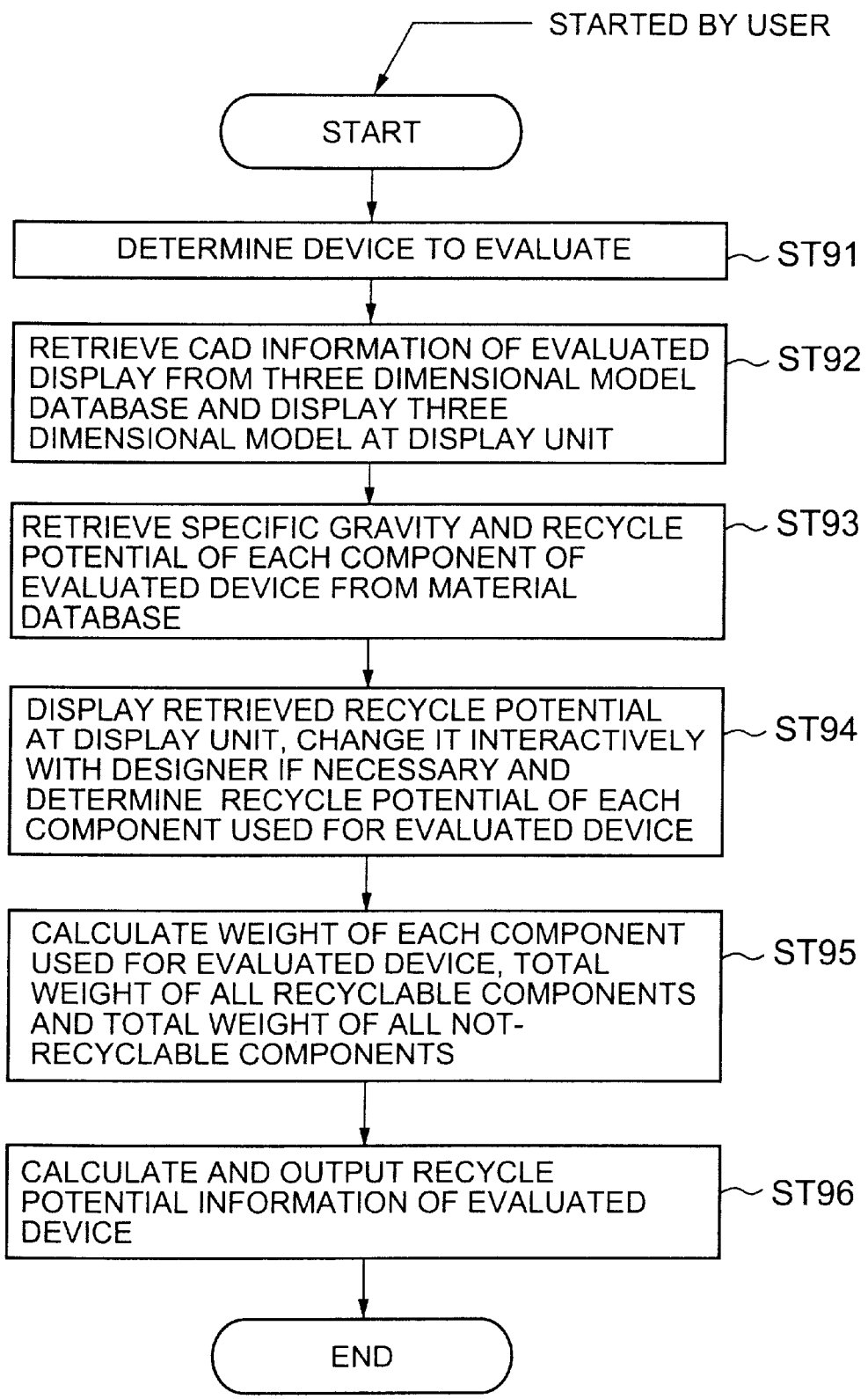
FIG. 32 is a flowchart for explaining a recycle potential calculation process executed by a device assessment program according to the present invention.

FIG. 32 is a flowchart for explaining a recycle potential calculation process executed by the device assessment program 48 according to the present invention. The recycle potential calculation process will now be described.

In the case in which the device assessment program 48 estimates the recycle potential, the material database 44 manages materials allocated by the CAD program 41 with its specific gravity and also manages whether or not the material is recyclable as shown in FIG. 33.

When the recycle potential calculation request is conducted by the designer, the device assessment program 48 determines a device to be evaluated interactively by the designer in step ST91 in FIG. 31. Subsequently, in step ST92, the CAD information of the evaluated device is retrieved from the three-dimensional model database 43. Based on the retrieved CAD information, the three-dimensional model of the evaluated device is displayed on the display unit 65 in FIG. 1.

Thereafter, in step ST93, the device assessment program 48 accesses the material database 44 by the material name or number, as a find key, indicated by the CAD information retrieved in the step ST92 and retrieves specific gravity of each component used for the evaluated device and recycle potential information of each component.

In step ST94, the recycle potential information corresponds to each component and is displayed in a recyclable component setting window on the display unit 65 in FIG. 1 as shown in FIG. 34. In addition, the recycle potential information is changed from "YES" (recyclable) to "NO" (not recyclable) interactively by the designer if necessary.

That is, the recycle potential is basically determined based on the material. However, when the original material is painted or is added to another material to make it stronger, the resulting composite material is determined as not recyclable even if the original material itself is recyclable. But, in general, the CAD program 41 simply allocates materials to components used for the evaluated device without considering paints or addition of other materials.

The device assessment program 48 determines the recycle potential interactively with the designer, instead of determining the recycle potential based on only the recycle potential information managed by the material database 44.

In step ST95, the specific gravity of each component retrieved in the step ST93 is multiplied by the volume of each component indicated by CAD information retrieved in step ST92 so that weight of each component is calculated. After that, total weight of all recyclable components and total weight of all non-recyclable components are calculated.

Subsequently, in step ST96, based on an equation:

$$\text{recyclable rate} = \frac{\text{total recyclable component weight}}{\text{total component weight}}$$

the recyclable rate of the evaluated device is calculated and output to the display unit 65 in FIG. 1.

As described above, in order to assess the environmental impact, the device assessment program 48 calculates and outputs the recycle potential of the evaluated device. Alternatively, the device assessment program 48 may provide the recycle potential information area in the environmental impact information table and output the recycle potential information of each component in the table.

In addition to calculating the recycle potential, the device assessment program 48 provides the original color display mode, the material distinguishable display mode and another mode in which the same material of the selected component is shown using an identical color and other materials are shown using another single color (or other colors other than the identical color for the selected component).

After all, the recycle potential of the device is determined based on materials of components used for the device. The recycle potential calculation process makes it possible for the designer to recognize where the components made of recyclable materials are located. Therefore, it is possible for the designer to consider how to change which material to another material and how the recycle potential rate can be improved.

While the recycle potential rate is being calculated, the device assessment program 48 can execute the above decomposition time calculation process (described in the flowcharts in FIG. 20 and FIG. 21) and comparison assessment process (described in the flowcharts in FIG. 22).

By providing these processes according to the present invention, the designer can consider easily and effectively whether a newly designed device improves its decomposability, reduces its weight, is minimized more or is simplified.

Generally, when a maker designs a device, the maker initiates a design report for the device. Accordingly, the device assessment program 48 can additionally provide a function for recording the $CO_2$, $NO_x$ and $SO_x$ amounts produced and the recycle potential for the designed device and another function for making a report of the information recorded above.

The present invention is not limited in the above descriptions. In the embodiment, the design support program 47 realizing the design support apparatus and the device assessment program 48 realizing the device assessment apparatus are provided in the single information processing apparatus 40 but may be separately provided in two apparatuses.

Moreover, in the embodiment, the environmental impact database 45 manages the production rates of $CO_2$, $NO_x$ and $SO_x$ per unit weight but may manage the production rates of those chemicals per unit volume.

The present invention is not limited to the specifically disclosed embodiments, variations and modifications, and other variations and modifications may be made without departing from the scope of the present invention.

The present application is based on Japanese Priority Application No. 11-154669 filed on Jun. 2, 1999, the entire contents of which are hereby incorporated by reference.

What is claimed is:

1. A computer-readable recording medium recorded with program code for causing a computer to support a CAD system in designing a device made of at least one component, said program comprising the code for:

(a) specifying a material of the component indicated by a process request of the CAD system based on a plurality of design information of the CAD system;

(b) retrieving an environmental impact rate of the material specified by the code (a) by accessing a database managing the environmental impact rate per unit weight of the each material;

(c) calculating an environmental impact of the component based on the environmental impact rate retrieved by the code (b) and weight of the component indicated by the process request;

(d) calculating the environmental impact of the device based on each component calculated by the code (c); and (e) selectively outputting the environmental impact of at least one component, which impact is calculated by the code (c), or the environmental impact of the device, which impact is calculated by the code (d);

so that the environmental impact of the component or the device indicated by the CAD system is assessed.

2. The computer-readable recording medium as claimed in claim 1, said program comprising the code for:

(f) calculating ratios of the environmental impact calculated by the code (c) in response to an assess request, for each environmental impact calculated by the code (c) in response to other assess requests when the current assess request is conducted for the same component; and (g) outputting a graph showing the ratios calculated by the code (f).

3. The computer-readable recording medium as claimed in claim 1, wherein said code (d) displays the environmental impact calculated by the code (c) in a CAD edit window.

4. The computer-readable recording medium as claimed in claim 2, wherein said code (g) displays a graph showing the ratios calculated in the code (f) in a CAD edit window.

5. The computer-readable recording medium as claimed in claim 1, wherein said code (d) further displays the environmental impact of each component calculated by the code (c).

6. The computer-readable recording medium as claimed in claim 1, said program comprising the code for:

(h) displaying a three-dimensional model of the device indicated by the process request by using unique colors, each of which corresponds to a different material, on a display.

7. The computer-readable recording medium as claimed in claim 1, said program comprising the code for:

(i) displaying the three-dimensional model of the device on the display such that the same material of the component indicated by the process request is shown by using an identical color and other materials are shown by using another color.

8. The computer-readable recording medium as claimed in claim 7, wherein when the component indicated by the process request is behind other components, said code (i) displays the other components by using a translucent color.

9. The computer-readable recording medium as claimed in claim 6, wherein said code (h) displays a component, a material of which is not defined, by using a special color.

10. The computer-readable recording medium as claimed in claim 1, said program comprising the code for:

(j) specifying a decomposition process for each component of the device indicated by the process request and a number of decomposition steps in the decomposition process, obtaining a decomposition time per unit time of the decomposition process and estimating a decomposition time of the device.

11. The computer-readable recording medium as claimed in claim 10, said program comprising the code for:

(k) defining a compared device that is to be compared to the device indicated by the process request; and (l) outputting a comparison of the decomposition time estimated in the code (j) for the device indicated by the process request and the decomposition time estimated in the code (j) for the compared device defined in the code (k).

12. The computer-readable recording medium as claimed in claim 11, wherein said code (l) outputs a comparison, by at least one of weight, volume and number of components, of the component used for the device indicated by the process request and the same component used for the compared device defined in the code (k).

13. A computer-readable recording medium recorded with program code for causing a computer to support a CAD system in designing a device made of at least one component, said program comprising the code for:

(a) obtaining a plurality of CAD design information of a device indicated by a process request of the CAD system;

(b) specifying a material of the component indicated by the process request based on the CAD design information obtained by the code (a);

(c) obtaining recycle information of the material specified by the code (b) by accessing a database managing the recycle information that indicates whether or not each material is recyclable and updating the recycle information when the recycle information is changed from recyclable to not recyclable;

(d) calculating a recycle potential of the device indicated by the process request based on the recycle information provided by the code (c) and an amount of each component used for the device; and (e) outputting the recycle potential calculated by the code (d), so that the recycle potential of the device designed by the CAD system is assessed.

14. A design support apparatus for supporting a CAD system in designing a component, comprising:

a specifying part specifying a material of the component indicated by a process request of the CAD system based on a plurality of design information of the CAD system;

a retrieving part retrieving an environmental impact rate of the material specified by the specifying part by accessing a database managing the environmental impact rate per unit weight of the each material;

a calculating part calculating an environmental impact of the component based on the environmental impact rate retrieved by the retrieving part and weight of the component indicated by the process request; and an outputting part outputting the environmental impact of the component, which impact is calculated by the calculating part, so that the environmental impact of the component indicated by the CAD system is assessed.

15. A device assessment apparatus for supporting a CAD system designing a device made of at least one component, comprising:

an obtaining part obtaining a plurality of CAD design information of the device indicated by a process request of the CAD system;

a specifying part specifying a material of the component indicated by a process request of the CAD system based on the design information of the CAD system;

a retrieving part retrieving an environmental impact rate of the material specified by the specifying part by accessing a database managing the environmental impact rate per unit weight of the each material;

a first calculating part calculating an environmental impact of the component based on the environmental impact rate retrieved by the retrieving part and weight of the component indicated by the process request;

a second calculating part calculating the environmental impact of the device based on each component calculated by the first calculating part; and an outputting part outputting the environmental impact of at least one component, which impact is calculated by the first calculating part, and the environmental impact of the device, which impact is calculated by the second calculating part;

so that the environmental impacts of the component and the device that are designed by the CAD system is assessed.

16. A device assessment apparatus for supporting a CAD system in designing a device made of at least one component, comprising:

an obtaining part obtaining a plurality of CAD design information of a device indicated by a process request of the CAD system;

a specifying part specifying a material of the component indicated by a process request of the CAD system based on the design information of the CAD system;

an obtaining part obtaining recycle information of the material specified by the specifying part by accessing a database managing the recycle information that indicates whether or not each material is recyclable and updating the recycle information when the recycle information is changed from recyclable to not recyclable;

a calculating part calculating a recycle potential of the device indicated by the process request based on the recycle information provided by the obtaining part and an amount of each component used for the device; and an outputting part outputting the recycle potential calculated by the calculating part, so that the recycle potential of the device designed by the CAD system is assessed.

* * * * *